(12) United States Patent
Hama et al.

(10) Patent No.: US 8,884,272 B2
(45) Date of Patent: Nov. 11, 2014

(54) AMORPHOUS OXIDE SEMICONDUCTOR MATERIAL, FIELD-EFFECT TRANSISTOR, AND DISPLAY DEVICE

(75) Inventors: Takeshi Hama, Kanagawa (JP);
Masayuki Suzuki, Kanagawa (JP);
Atsushi Tanaka, Kanagawa (JP);
Fumihiko Mochizuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 617 days.

(21) Appl. No.: 12/853,338

(22) Filed: Aug. 10, 2010

(65) Prior Publication Data
US 2011/0042668 A1 Feb. 24, 2011

(30) Foreign Application Priority Data

Aug. 18, 2009 (JP) ................................ 2009-189340
Jan. 7, 2010 (JP) ................................ 2010-002370

(51) Int. Cl.
*H01L 29/08* (2006.01)
*H01L 29/786* (2006.01)
*H01L 27/32* (2006.01)

(52) U.S. Cl.
CPC ......... *H01L 29/7869* (2013.01); *H01L 27/3262* (2013.01); *H01L 2251/5338* (2013.01); *H01L 27/3248* (2013.01)
USPC ........... 257/40; 257/57; 257/59; 257/E51.001

(58) Field of Classification Search
USPC .............. 257/40, 43, 57, 59, 72, 83, E51.001, 257/E51.003, E29.006
See application file for complete search history.

(56) References Cited

U.S. PATENT DOCUMENTS

| 7,696,513 B2 * | 4/2010 | Hayashi et al. ................. 257/43 |
| 7,923,723 B2 * | 4/2011 | Hayashi et al. ................. 257/43 |
| 2007/0252147 A1 | 11/2007 | Kim et al. |

FOREIGN PATENT DOCUMENTS

| JP | 2000-044236 A | 2/2000 |
| JP | 2007-115902 A | 5/2007 |
| JP | 2007-250984 A | 9/2007 |
| JP | 2007-281409 A | 10/2007 |
| JP | 4170454 B2 | 10/2008 |
| JP | 2009-164393 A | 7/2009 |
| JP | 2009-253204 A | 10/2009 |

OTHER PUBLICATIONS

Science, 300 (2003), pp. 1269-1272.
Nature, 432 (2004), pp. 488-492.
Journal of Information Display, 9 (2008), pp. 21-29.
SID08 Digest (2008), pp. 1215-1218.
Japanese Journal of Applied Physics, 48 (2009), pp. 03B018-1-03B018-5.
"Instability of Amorphous IGZO TFTs under Light Illumination," The 15th Int. Workshop on Active-Matrix Flatpanel Display and Devices [AM-FPD08] ~TFT Technologies and FPD Materials ~ (Jul. 2-4, 2008, Tokyo, Japan).
Trial Decision dated Sep. 4, 2012 which was issued in the corresponding Japanese Patent Application.
Office Action dated Jul. 14, 2014 which was issued in a Chinese patent application corresponding to the instant patent application.

* cited by examiner

*Primary Examiner* — David Vu
(74) *Attorney, Agent, or Firm* — SOLARIS Intellectual Property Group, PLLC

(57) ABSTRACT

There is provided an amorphous oxide semiconductor material including an amorphous oxide semiconductor including In, Ga and Zn, wherein when In:Ga:Zn=a:b:c denotes an element composition ratio of the oxide semiconductor, the element composition ratio is defined by the range of $a+b=2$ and $b<2$ and $c<4b-3.2$ and $c>-5b+8$ and $1 \leq c \leq 2$.

8 Claims, 23 Drawing Sheets

AMORPHOUS OXIDE SEMICONDUCTOR MATERIAL, FIELD-EFFECT TRANSISTOR, AND DISPLAY DEVICE

CROSS-REFERENCE TO RELATED APPLICATIONS

This application is based on and claims priority under 35 USC 119 from Japanese Patent Application No. 2009-189340 filed on Aug. 18, 2009 and Japanese Patent Application No. 2010-002370 filed on Jan. 7, 2010, the disclosures of which are incorporated by reference herein.

BACKGROUND

1. Technical Field

The present invention relates to an amorphous oxide semiconductor material, a field-effect transistor, and a display device.

2. Related Art

Field-effect transistors are widely used as unit elements of integrated circuits for semiconductor memories, high-frequency signal amplifying elements, and elements for driving display elements such as liquid crystal display elements, and transistors that have been made into a thin film are called thin-film transistors (TFT). Additionally, silicon TFTs having an active layer comprising amorphous silicon that is formable in a large area are used in flat panel displays.

In recent years, flat panel display technologies (large-screen, thin, lightweight) have undergone remarkable progress, and attempts to apply those flat panel display technologies to flexible substrates (displays that are lightweight and bend) have been made towards making them even thinner and more lightweight. On the other hand, silicon TFTs, which are currently the mainstream of TFTs that drive displays, have a high manufacturing temperature and it is difficult to form silicon TFTs on flexible substrates.

Amidst this background, oxide semiconductors are currently garnering attention as active layers of TFTs. In particular, In—Ga—Zn—O (hereinafter abbreviated as IGZO) reported by Hosono et al. of the Tokyo Institute of Technology shows promise as a material for new TFTs because it is formable at room temperature and exhibits excellent characteristics as a semiconductor even when amorphous, and studies on IGZO are being extremely vigorously carried out (see non-patent documents 1 and 2 listed below).

Among these studies, in relation to the optical properties of amorphous IGZO, when a TFT having an active layer comprising amorphous IGZO is applied to a display device such as an organic EL display, sometimes that active layer is irradiated with light, so as described in non-patent documents 3 to 6 listed below, many results of studies relating to the light irradiation properties of amorphous IGZO have been reported.

In non-patent documents 3 and 4, reports are made in relation to TFT properties when a TFT whose gate electrode comprises n-type Si, whose gate insulating film comprises a thermally-oxidized film, whose source and drain electrodes comprise Al and whose active layer comprises amorphous IGZO (In:Ga:Zn=1:1:1) has been irradiated with monochromatic light in a dark place.

Specifically, it can be confirmed that, when the irradiation amount is made constant and the wavelength of the monochromatic light is changed, the TFT properties virtually do not change (the drain current shifts slightly) when the TFT is irradiated with 460 nm$\leq\lambda\leq$660 nm monochromatic light, but when the TFT is irradiated with $\lambda\leq$420 nm monochromatic light, the TFT properties greatly change (the threshold voltage Vth undergoes a 7 V negative shift when the TFT is irradiated with $\lambda$=365 nm (3.4 eV) monochromatic light). Further, it can be confirmed that, also when the monochromatic light wavelength is fixed ($\lambda$=420 nm) and the irradiation intensity is changed, changes in the TFT properties (negative shift in Vth) also become greater as the irradiation intensity increases. Moreover, it is understood that, in addition to Vth, the mobility, the sub-threshold swing (S value) and the off-state current also greatly change and IGZO is affected by the visible light short-wavelength region.

In non-patent documents 3 and 4, it is written that it is possible to drive an organic EL element without using a light blocking film because the transparent wavelength peak of a blue color filter and the wavelength peak of blue light of an organic electroluminescent element (organic EL element) are 450 nm. However, considering that a blue color filter passes about 70% of 400 nm light, that the skirt of the emission spectrum of blue light of an organic EL element continues to 420 nm, and that, thinking about the fabrication of a transparent device, the device is exposed to sunlight, it has not been shown that a TFT having IGZO fabricated by these documents as its active layer is sufficient.

Similarly, in non-patent documents 5 and 6 also, results of studies with respect to the light irradiation properties of amorphous IGZO are reported.

Specifically, first, polycrystalline IGZO where In:Ga:Zn=1:1:1 is used as a target to form an amorphous IGZO film (In:Ga:Zn=1.01:1.00:0.76). A TFT has, from its substrate side, the configuration of glass/Mo (gate electrode)/SiO2 or SiNx:H (gate insulating film)/IGZO (active layer)/SiO2/SiN (passivation layer)/Mo (source and drain electrodes). It can be confirmed that, by irradiating this TFT with $\lambda\leq$440 nm monochromatic light, the TFT properties change (negative shift in Vth). Moreover, it can also be confirmed that the amount of change in the TFT properties becomes greater as the amount of time in which the TFT is irradiated with the monochromatic light is made longer. Further, by administering a heat treatment at 120° C., there is obtained the result that the TFT properties recover such that the same properties as the initial properties are obtained.

As a conclusion of the results of the studies above, it is understood that, when an active layer comprising amorphous IGZO of a TFT is irradiated with visible light, the TFT properties (an increase in the off-state current, a shift in Vth, etc.) greatly change with respect to light in the visible light short-wavelength region (light whose wavelength is in the neighborhood of 400 nm to 420 nm). Additionally, these changes in properties have a great affect on stable operation at the time of TFT driving.

Thus, when a TFT using amorphous IGZO for its active layer is used as a TFT for driving a display element, in order to allow the TFT to stably operate, in patent document 1, light blocking means with respect to the amorphous IGZO is employed. Further, in patent document 2, a structure that does not expose the amorphous IGZO to blue light (light in the visible light short-wavelength region) is employed.

However, in the inventions of patent documents 1 and 2, the purpose is to not allow the amorphous IGZO serving as the active layer to be irradiated with light, and there is no description in relation to improving the light irradiation properties of the amorphous IGZO itself.

Here, it is conceivable to control the composition ratio of In, Ga and Zn in order to improve the light irradiation properties of the amorphous IGZO. To that end, materials that limit the composition ratio of the amorphous IGZO to particular ranges have also been proposed (e.g., see patent documents 3 to 6 listed below).

In patent document 3, there is reported an amorphous oxide represented by $Zn_x[Al, Ga]_yIn_zO(x+3y/2+3z/2)$:[ratio x/y is in the range of 0.2 to 2, and ratio z/y is in the range of 0.4 to 1.4]. As an example, there is shown a fabrication example in the neighborhood of In:Ga:Zn=1:1:1.

However, the purpose is to use the amorphous IGZO as a transparent conductive film, that is, as an electrode, and the purpose is not to use the amorphous IGZO as a semiconductor. Further, a carrier concentration of a considerably high density is supposed because the electron concentration is equal to or greater than $1 \times 10^{18}$ to $10^{22}/cm^3$ ($10^{19}/cm^3$ even in relation to the example). When this amorphous oxide is used as an active layer of a transistor, it is conceivable that the realization of normally-off is extremely difficult.

In patent document 4, there is reported an amorphous oxide semiconductor material of a composition where the atomic composition ratio represented by In/(In+Zn) is from 35 at. % to 55 at. % and where the atomic composition ratio represented by Ga/(In+Ga+Zn) is equal to or less than 30 at. %.

However, no experimental data relating to light absorption are shown as examples.

In patent document 5, there is reported a TFT having as its active layer an amorphous IGZO capable of passing a constant current stably for a long time. This document has a graph showing changes in the TFT properties (Vg-Id characteristics) at the time of light irradiation.

However, in patent document 5, there is fabricated a TFT having no property changes with respect to light irradiation in an In-rich, Ga-poor and Zn-poor region, and there is no description suggesting photostability in a Ga-rich region.

Further, because there is no detailed description relating to the light source, it is unclear which wavelength region of light is affecting the TFT, and it is also unclear whether or not there is photostability with respect to the visible light short-wavelength region and particularly the visible light short-wavelength region of 400 to 420 nm. Consequently, when there is a defect or the like in the IGZO, sometimes the IGZO is affected even by light in the visible light short-wavelength region, so there is also the potential to fabricate a TFT having no property changes with respect to light irradiation in the visible light short-wavelength region. Further, there is also the potential to manufacture a TFT having no property changes with respect to light irradiation in the visible light short-wavelength region outside the range of 400 to 420 nm.

Moreover, in the amorphous IGZO configuring the active layer of each TFT, the composition ratios of In, Ga and Zn differ because of the result of inductively coupled plasma (ICP), but in the end it is unclear which composition amount is affecting the improvement of photostability.

Moreover still, the same target is used to fabricate the amorphous IGZO, so considering ICP error (±0.2), plural TFTs having active layers comprising amorphous IGZO of substantially the same composition are fabricated, but the TFT properties with respect to light irradiation of each TFT greatly differ, and reproducibility is considered to be low.

In patent document 6, there is reported a field-effect transistor having for its active layer an amorphous oxide semiconductor that includes the element In, the element Zn and element X (the element Ga is included as one candidate for element X) and satisfies In/(In+Zn+X)=0.200 to 0.600 and Zn/(In+Zn+X)=0.200 to 0.800. In the examples, there are described the electrical properties of a TFT having for its active layer IGZO in which the Ga concentration has been changed, but there are no data relating to the optical properties or results suggesting photostability in a Ga-rich region. Additionally, a composition range is claimed including also a Ga-rich region with good photostability, but according to the specification, it is necessary for the transistor to take a structure that blocks a semiconducting phase, so it is thought that the optical properties are not good. The field-effect transistor also differs from the present invention in that the film thickness is from 1 nm to 15 nm and extremely thin.

Non-Patent Document 1: Science, 300 (2003), pp. 1269-1272

Non-Patent Document 2: Nature, 432 (2004), pp. 488-492

Non-Patent Document 3: Journal of Information Display, 9 (2008), pp. 21-29

Non-Patent Document 4: SID08 Digest (2008), pp. 1215-1218

Non-Patent Document 5: Japanese Journal of Applied Physics, 48 (2009), pp. 03B018-1-03B018-5

Non-Patent Document 6: "Instability of Amorphous IGZO TFTs under Light Illumination," The 15th Int. Workshop on Active-Matrix Flatpanel Display and Devices [AM-FPD08] ~TFT Technologies and FPD Materials~(Jul. 2-4, 2008, Tokyo, Japan)

Patent Document 1: Japanese Patent Application Laid-Open (JP-A) No. 2007-115902

Patent Document 2: JP-A No. 2007-250984

Patent Document 3: Japanese Patent No. 4,170,454

Patent Document 4: JP-A No. 2007-281409

Patent Document 5: U.S. Patent Application Publication No. 2007/0252147

Patent Document 6: JP-A No. 2009-253204

SUMMARY

It is a main object of the present invention to provide an amorphous oxide semiconductor material where light absorption is reduced with respect to light whose wavelength is in the visible light short-wavelength region of 400 to 420 nm.

The above-described problem of the present invention is solved by the means described below.

A first aspect of the present invention provides an amorphous oxide semiconductor material including an amorphous oxide semiconductor including In, Ga and Zn, wherein when In:Ga:Zn=a:b:c denotes an element composition ratio of the oxide semiconductor, the element composition ratio is defined by the range of a+b=2 and b<2 and c<4b−3.2 and c>−5b+8 and 1≤c≤2.

A second aspect of the present invention provides the amorphous oxide semiconductor material according to the first aspect, wherein its optical band gap is equal to or greater than 3.79 eV.

A third aspect of the present invention provides an amorphous oxide semiconductor material including an amorphous oxide semiconductor including In, Ga and Zn, wherein when In:Ga:Zn=a:b:c denotes an element composition ratio of the oxide semiconductor, the element composition ratio is defined by the range of a+b=2 and c<4b−3.2 and c<−5b+8 and 1≤c, and its optical band gap is equal to or greater than 3.79 eV.

A fourth aspect of the present invention provides a field-effect transistor having an active layer that comprises the amorphous oxide semiconductor material according to the first aspect of the present invention and whose electrical conductivity σ is $10^{-9} \leq \sigma \leq 10^{-2}$ (S/cm).

A fifth aspect of the present invention provides the field-effect transistor according to the fourth aspect, wherein the amorphous oxide semiconductor material is heat-treated.

A sixth aspect of the present invention provides a display device equipped with the field-effect transistor according to the fourth aspect.

A seventh aspect of the present invention provides a bottom-emission display device including:
a substrate;
the field-effect transistor according to the fourth aspect of the present invention which is placed on the substrate and has a bottom-gate structure; and
an organic electroluminescent element that is electrically connected to the field-effect transistor on the substrate,
wherein light emitted from the organic electroluminescent element is produced from the substrate side.

According to the present invention, there can be provided an amorphous oxide semiconductor material where light absorption is reduced with respect to light whose wavelength is in the visible light short-wavelength region of 400 nm to 420 nm.

BRIEF DESCRIPTION OF THE DRAWINGS

An exemplary embodiment of the present invention will be described in detail based on the following figures, wherein.

DETAILED DESCRIPTION

Figure 1:
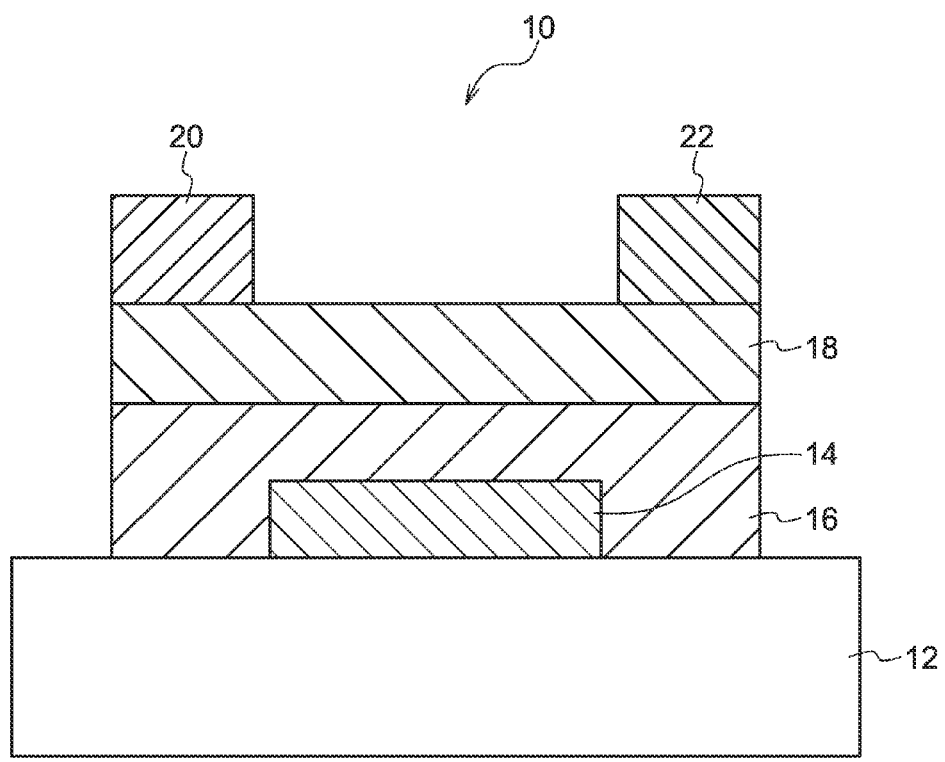
FIG. 1 is a schematic diagram showing a TFT with a bottom-gate structure as one example of a TFT pertaining to the exemplary embodiment of the present invention.

An exemplary embodiment of an amorphous oxide semiconductor material, a field-effect transistor and a display device of the present invention will be described below using the drawings. Portions having substantially the same function will be given the same reference signs throughout all of the drawings and described, and description thereof will be omitted in some instances.

1. Amorphous Oxide Semiconductor Material

First, the amorphous oxide semiconductor material pertaining to the exemplary embodiment of the present invention will be described.

<Configuration>

The configuration of the amorphous oxide semiconductor material pertaining to the exemplary embodiment of the present invention is as follows.

The amorphous oxide semiconductor material comprises an amorphous oxide semiconductor including In, Ga and Zn, and when In:Ga:Zn=a:b:c denotes an element composition ratio of the oxide semiconductor, the element composition ratio is defined by the range of a+b=2 and b<2 and c<4b−3.2 and c>−5b+8 and 1≤c≤2.

When the amorphous oxide semiconductor material has this composition, light absorption is reduced with respect to light whose wavelength is in the visible light short-wavelength region of 400 to 420 nm.

The element composition ratio of the oxide semiconductor is preferably defined by the range of a+b=2 and $1.3 \le b<2$ and $c>-5b+8$ and $1 \le c \le 2$. Further, the element composition ratio of the oxide semiconductor is more preferably defined by the range of a+b=2 and $1.3 \le b \le 1.5$ and $c>-5b+8$ and $1 \le c \le 2$ for the reason that light absorption is reduced even more.

The optical band gap of the amorphous oxide semiconductor material is equal to or greater than 3.7 eV and preferably equal to or greater than 3.79 eV for the reason that light absorption is reduced even more.

Further, in relation also to an amorphous oxide semiconductor material whose element composition ratio is defined by the range of a+b=2 and $c<4b-3.2$ and $c<-5b+8$ and $1 \le c$, the optical band gap is equal to or greater than 3.7 eV and more preferably equal to or greater than 3.79 eV and sufficiently wide, light absorption can be reduced with respect to light whose wavelength is in the visible light short-wavelength region of 400 nm to 420 nm. The element composition ratio is more preferably defined by the range of a+b=2 and $1.3 \le b$ and $c<-5b+8$ and $1 \le c$ for the reason that light absorption is reduced even more.

<Manufacturing Methods>

Methods of manufacturing the amorphous oxide semiconductor material pertaining to the exemplary embodiment of the present invention are as follows.

Examples of methods of manufacturing the amorphous oxide semiconductor material include powder manufacturing methods, such as solid-phase reaction, the sol-gel process, the oxalate method, the alkoxide method, and coprecipitation, and thin-film manufacturing methods, such as sputtering, laser ablation, chemical vapor deposition (CVD), and metal-organic decomposition (MOD).

In powder manufacturing methods, the amorphous oxide semiconductor material can be fabricated by mixing together a compound including In, a compound including Ga, and a compound including Zn.

Examples of compounds including In include $In_2O_3$, $In(NO_3)_3$, $In(NO_3)_3.nH_2O$, $In(CH_3COO)_3$, $In(CH_3COO)_2(OH)$, $In_2O_3.nH_2O$, InN, $In(OH)_3$, InO(OH), $In_2(C_2O_4)_3$, $In_2(C_2O_4)_3.4H_2O$, $In(C_2H_5OCS_2)_3$, and $In_2(SO_4)_3.nH_2O$.

Examples of compounds including Ga include $Ga_2O_3$, $Ga(NO_3)_3$, $Ga(NO_3)_3.nH_2O$, $Ga(CH_3COO)_3$, $Ga(CH_3COO)_2(OH)$, $Ga_2O_3.nH_2O$, GaN, $Ga(OH)_3$, GaO(OH), $Ga_2(C_2O_4)_3$, $Ga_2(C_2O_4)_3.4H_2O$, $Ga(C_2H_5OCS_2)_3$, and $Ga_2(SO_4)_3.nH_2O$.

Examples of compounds including Zn include ZnO, $Zn(C_2H_3O_2)_2$, $Zn(C_2H_3O_2)_2.2H_2O$, $ZnBr_2$, $ZnCO_3$, ZnS, $ZnCl_2$, $ZnF_2$, $ZnF_2.4H_2O$, $Zn(OH)_2$, $ZnI_2$, $Zn(NO_3)_2 6H_2O$, $ZnC_2O_4$, $Zn(CN)_2$, $Zn(OCH_3)_2$, $Zn(OC_2H_5)_2$, and $ZnSO_4$.

The composition ratio of the amorphous oxide semiconductor material can be adjusted by the input amount of the aforementioned raw materials.

In thin-film manufacturing methods, it is good to use a vapor film-forming method using a polycrystalline sintered body of an oxide semiconductor as a target. Among vapor deposition methods, sputtering and pulse laser deposition (PLD) are suitable. Moreover, sputtering is preferred from the standpoint of mass productivity.

For example, the vacuum and the oxygen flow rate are controlled and a film is formed by RF magnetron sputtering. The larger the oxygen flow rate is, the smaller the electrical conductivity can be made.

The composition ratio of the amorphous oxide semiconductor material can be adjusted by the selection or combination of the target, the selection of the sputter method per target, the sputter input power, and the film-forming pressure.

A heat treatment (annealing) can also be administered to the amorphous oxide semiconductor material that has been fabricated by a powder manufacturing method or a thin-film manufacturing method. By administering this heat treatment, it is possible to adjust the carrier concentration and the electrical conductivity of the amorphous oxide semiconductor material.

The temperature of the heat treatment of the amorphous oxide semiconductor material exceeds room temperature (e.g., 25° C.) and is less than 700° C., and the amorphous oxide semiconductor material is preferably heat-treated at a lower temperature from the standpoints of heat treatment time and heat treatment cost reduction.

The reason the heat treatment temperature exceeds room temperature is to adjust the electrical conductivity of the amorphous oxide semiconductor material, and the reason the heat treatment temperature is less than 700° C. is to not allow the amorphous oxide semiconductor material to crystallize.

Even when the heat treatment is administered to the amorphous oxide semiconductor material, light absorption is reduced with respect to light whose wavelength is in the visible light short-wavelength region of 400 nm to 420 nm. Further, the optical band gap of the amorphous oxide semiconductor material tends to increase albeit slightly, so it does not drop in comparison to the amorphous oxide semiconductor material before the heat treatment.

It can be confirmed by well-known X-ray diffraction that the amorphous oxide semiconductor material that has been fabricated by a powder manufacturing method or a thin-film manufacturing method is amorphous. Further, the film thickness of the amorphous oxide semiconductor material that has been fabricated by a thin-film manufacturing method can be obtained by stylus profilometry. The composition ratio can be obtained by fluorescent X-ray analysis. Further, the optical band gap can be obtained using a spectrophotometer. Moreover, the electrical conductivity can be determined using a resistivity meter.

2. Field-Effect Transistor

The field-effect transistor pertaining to the exemplary embodiment of the present invention is an active element that has at least a gate electrode, a gate insulating film, an active layer, a source electrode and a drain electrode and has the function of applying a voltage to the gate electrode, controlling the current flowing in the active layer and switching the current between the source electrode and the drain electrode. The field-effect transistor can be formed in either a staggered structure (also called a top-gate structure) or an inverse-staggered structure (also called a bottom-gate structure).

The active layer of the field-effect transistor comprises the aforementioned amorphous oxide semiconductor material, and its electrical conductivity σ is preferably $10^{-9} \le \sigma \le 10^{-2}$ (S/cm).

<Structure of Field-Effect Transistor>

Next, the structure of the field-effect transistor will be more specifically described. A thin-film transistor (TFT) will be described below as one example of the field-effect transistor.

FIG. 1 is a schematic diagram showing a TFT 10 with a bottom-gate structure as one example of the TFT pertaining to the exemplary embodiment of the present invention. The TFT 10 has a configuration where a gate electrode 14, a gate insulating layer 16 and an active layer 18 are laminated in order on a substrate 12 and where a source electrode 20 and a drain electrode 22 are disposed apart from each other on the surface of the active layer 18. Additionally, the active layer 18 comprises the aforementioned amorphous oxide semiconductor material.

When the TFT is the TFT 10 with the bottom-gate structure in this manner, when the TFT 10 is applied to a bottom-emission organic EL display device, sometimes the active layer 18 is irradiated with light including blue light from the light emitting layer of the organic EL display device, but the TFT 10 can stably operate without being affected by the light with which it is irradiated because the TFT 10 has the active layer 18 comprising the aforementioned amorphous oxide semiconductor material where light absorption is reduced with respect to the visible light short-wavelength region.

Figure 2:
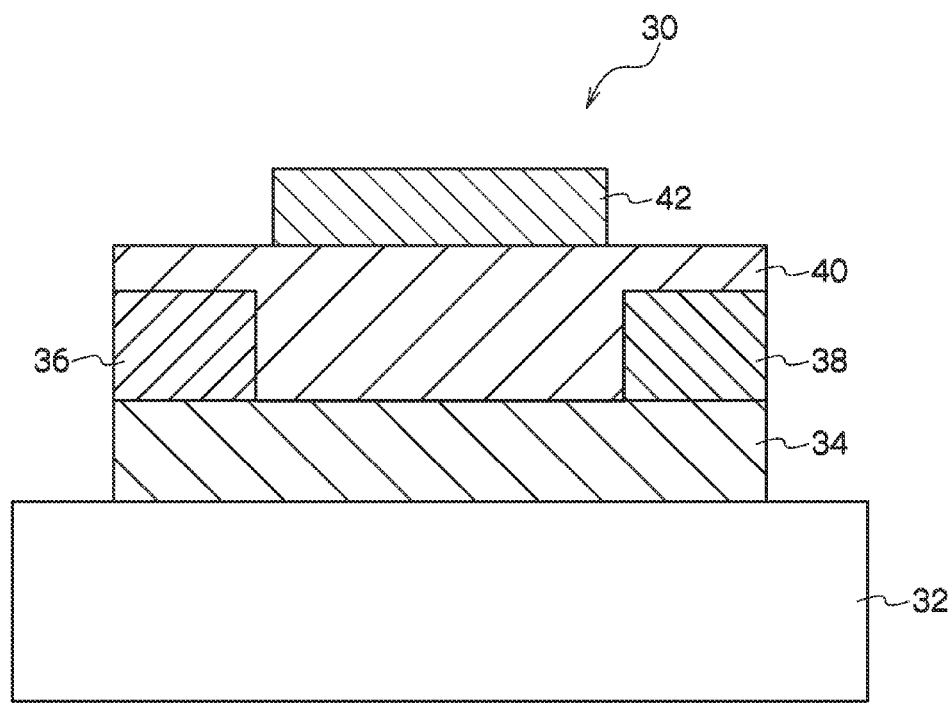
FIG. 2 is a schematic diagram showing a TFT with a top-gate structure as one example of the TFT pertaining to the exemplary embodiment of the present invention.

FIG. 2 is a schematic diagram showing a TFT 30 with a top-gate structure as one example of the TFT pertaining to the exemplary embodiment of the present invention. The TFT 30 has a configuration where an active layer 34 is laminated on the surface of a substrate 32, a source electrode 36 and a drain electrode 38 are disposed apart from each other on the active layer 34, and a gate insulating layer 40 and a gate electrode 42 are further laminated in order on these.

When the TFT is the TFT 30 with the top-gate structure in this manner, when the TFT 30 is applied to a bottom-emission organic EL display device, as compared to the TFT 10 with the bottom-gate structure, the source electrode 36, the drain electrode 38, the gate insulating layer 40 and the gate electrode 42 are on the active layer 34, so as compared to the TFT 10 with the bottom-gate structure, it is difficult for the active layer 34 to be irradiated with light including blue light from the light emitting layer of the organic EL display device. However, when there exists an exposed portion where the active layer 34 is not covered by the gate insulating layer 40 or the like or when the source electrode 36, the drain electrode 38, the gate insulating layer 40 and the gate electrode 42 covering the active layer 34 transmit light, the active layer 34 becomes irradiated with light including blue light from the light emitting layer of the organic EL display device. In the present exemplary embodiment, even in such cases, the TFT 30 can stably operate without being affected by the light with which it is irradiated because the TFT 30 has the active layer 34 comprising the aforementioned amorphous oxide semiconductor material where light absorption is reduced with respect to the visible light short-wavelength region.

The TFT pertaining to the present exemplary embodiment is capable of taking various configurations in addition to those described above and may also appropriately have a configuration equipped with a protective layer on the active layer or an insulating layer or the like on the substrate.

<Methods of Manufacturing Field-Effect Transistor>

Next, methods of manufacturing the aforementioned TFTs 10 and 30 will be briefly described.

In the method of manufacturing the TFT 10 with the bottom-gate structure, first, the substrate 12 for forming the TFT 10 is prepared, and the gate electrode 14 and the gate insulating layer 16 are sequentially formed on this substrate 12. Next, an oxide semiconductor film including In, Ga and Zn is formed on the gate insulating film 16, and patterning is performed with respect to this oxide semiconductor film to form the active layer 18. Then, the source and drain electrodes 20 and 22 are formed on the active layer 18. Thus, the TFT 10 with the bottom-gate structure is fabricated. The oxide semiconductor film (or the active layer 18) may also be heat-treated directly after the formation of the oxide semiconductor film, directly after the patterning of the oxide semiconductor film, or after the fabrication of the TFT 10.

In the method of manufacturing the TFT 30 with the top-gate structure, first, the substrate 32 for forming the TFT 30 is prepared, an oxide semiconductor film including In, Ga and Zn is formed on this substrate 32, and patterning is performed with respect to this oxide semiconductor film to form the active layer 34. Then, the source and drain electrodes 36 and 38 are formed on the active layer 34, and thereafter the gate insulating layer 40 and the gate electrode 42 are sequentially formed. Thus, the TFT 30 with the top-gate structure is fabricated. In this case also, the oxide semiconductor film (or the active layer 34) may also be heat-treated directly after the formation of the oxide semiconductor film, directly after the patterning of the oxide semiconductor film, or after the fabrication of the TFT 30.

In addition, it is also possible to apply a bottom-gate structure TFT with a simple structure where Si is used for the gate electrode and a thermally-oxidized film is used for the gate insulating film. In this case, it suffices to form the active layer on the thermally-oxidized film, perform patterning, and thereafter form the source and drain electrodes. In this case also, the oxide semiconductor film (or the active layer 34) may also be heat-treated directly after the formation of the oxide semiconductor film, directly after the patterning of the oxide semiconductor film, or after the fabrication of the TFT 30.

<Details of Each Configuration of Field-Effect Transistor>

The materials, thicknesses, and pattern forming methods of each configuration of the TFT will be described in detail below.

(Substrate)

A substrate where at least the surface on which the TFT is formed has an insulating property and which has dimensional stability, solvent resistance, workability, and also heat resistance with respect to the heat treatment is used for the substrate. Further, there is used a substrate that suppresses the transmission of moisture and oxygen when, for example, an organic EL display device is manufactured as the final product and which transmits light when light is transmitted from the substrate side to perform light emission and display. As a substrate that satisfies these conditions, inorganic materials such as glass and yttria-stabilized zirconia (YSZ) are suitable. Using alkali-free glass is preferred in order to reduce ion elution from the glass. Further, when soda-lime glass is used, using glass to which a barrier coat of silica or the like has been administered is preferred.

When the heat treatment temperature in a later-described process is low, it is also possible to use organic materials such as a saturated polyester resin, a polyethylene terephthalate (PET) resin, a polyethylene naphthalate (PEN) resin, a polybutylene terephthalate resin, polystyrene, polycycloolefin, a norbornene resin, poly(chlorotrifluoroethylene), a cross-linked diester fumarate resin, a polycarbonate (PC) resin, a polyethersulfone (PES) resin, a polysulfone (PSF, PSU) resin, a polyarylate (PAR) resin, a cyclic polyolefin (COP, COC) resin, a cellulose resin, a polyimide (PI) resin, a polyamide-imide (PAI) resin, a maleimide-olefin resin, a polyamide (PA) resin, an acrylic resin, a fluorinated resin, an epoxy resin, a silicone resin film, a polybenzoazole resin, an episulfide compound, a liquid crystal polymer (LCP), a cyanate resin, and an aromatic ether resin. In addition, there can also be used a laminated plastic material having at least one junction interface between a composite plastic material with silicon oxide particles, a composite plastic material with metal nanoparticles, inorganic oxide nanoparticles, or inorganic nitride nanoparticles, a composite plastic material with metal or inorganic nanofibers and/or microfibers, carbon fiber, a composite plastic material with carbon nanotubes, a composite plastic material with glass flakes, glass fibers, or glass beads, a composite plastic material with particles having a clay mineral or a mica derivative crystal structure, or thin glass and the above-described single organic materials or a composite material having barrier performance having at least one or more interface junction by alternately laminating an inorganic layer (e.g., $SiO_2$, $Al_2O_3$, SiOxNy) and an organic layer comprising the aforementioned materials.

When it is not necessary to produce light from the substrate side, for example, a metal substrate made of stainless steel, Fe, Al, Ni, Co, Cu, or an alloy of these or the like, or a semiconductor substrate made of Si or the like, may be used, and an insulating film for ensuring electrical insulation may be disposed on the substrate. When the substrate is a metal substrate, there are also inexpensive metals, the strength of the metal substrate is high even when the thickness of the metal substrate is thin, and the substrate has a high barrier property with respect to moisture and oxygen in the atmosphere. In regard to the shape, structure, and size of the substrate, there are no particular restrictions, and these can be appropriately selected depending on the purpose. Usually, the shape of the substrate is preferably tabular from the standpoints of handleability and the ease of forming the TFT. The substrate may have a single layer structure or a laminate structure. Further, the substrate may be configured by a single member or by two or more members.

(Gate Electrode)

A conductive and heat resistant material is used for the gate electrode. For example, the gate electrode is formed using a metal such as Al, Mo, Cr, Ta, Ti, Au, or Ag, or an alloy such as Al—Nd or APC, or a metal oxide conductive film such as tin oxide, zinc oxide, indium oxide, indium tin oxide (ITO), or indium zinc oxide (IZO). For example, the gate electrode is formed on the substrate in accordance with a method appropriated selected in consideration of its suitability to the material used from among wet methods such as printing and coating, physical methods such as vacuum deposition, sputtering, and ion plating, and chemical methods such as CVD and plasma CVD. The thickness of the gate electrode is preferably from 10 nm to 1000 nm.

After film formation, patterning of the gate electrode into a predetermined shape is performed by photolithography. At this time, the gate electrode and a gate wire are preferably patterned at the same time.

(Gate Insulating Film)

An insulating and heat resistant material is used for the gate insulating film. For example, the insulating film may be an insulating film of $SiO_2$, SiNx, SiON, $Al_2O_3$, $Y_2O_3$, $Ta_2O_5$, or $HfO_2$ or an insulating film including at least two or more of these compounds. The gate insulating film is also formed on the substrate in accordance with a method appropriated selected in consideration of its suitability to the material used from among wet methods such as printing and coating, physical methods such as vacuum deposition method, sputtering, and ion plating, and chemical methods such as CVD and plasma CVD. Patterning of the gate insulating film into a predetermined shape is performed by photolithography as needed.

It is necessary for the gate insulating film to have thickness for lowering the leak current and improving the voltage withstand, but when the thickness is too large, this ends up leading to a rise in the drive voltage. Depending on the material of the gate insulating film, the thickness of the gate insulating film is preferably 10 nm to 10 μm and more preferably 50 nm to 1000 nm.

(Active Layer)

It is preferable to form the active layer using a vapor film-forming method using a polycrystalline sintered body of an oxide semiconductor including In, Ga and Zn as a target. Among vapor film-forming methods, sputtering and pulse laser deposition (PLD) are more preferable, and sputtering is particularly preferable from the standpoint of mass productivity.

For example, an amorphous film of IGZO is formed in a thickness of 20 nm to 150 nm by sputtering or PLD. It can be confirmed by X-ray diffraction that the IGZO film that has been formed is an amorphous film. Further, the film thickness can be obtained by stylus profilometry, and the composition ratio can be obtained by fluorescent X-ray analysis.

After the amorphous IGZO film has been formed, it is necessary to perform patterning by etching. When the active layer has no tolerance for the etching liquid used for its patterning, for example, a method that forms a pattern by so-called lift-off is the simplest and most convenient.

The patterning of the IGZO film can be performed by photolithography or etching. Specifically, the active layer is formed by pattern-forming a resist mask by photolithography in the portion of the IGZO film that is to be left as the active layer and etching the IGZO film formed on the gate insulating film with an acid solution such as hydrochloric acid, nitric acid, diluted sulfuric acid, or a mixed liquid of phosphoric acid, nitric acid and acetic acid (Al etching liquid; made by Kanto Chemical Co., Inc.). For example, using an aqueous solution including phosphoric acid, nitric acid and acetic acid is preferable because the exposed portion of the IGZO film can be reliably removed.

The present invention is not limited to the embodiment described above. For example, a case where the IGZO film is wet-etched and patterned has been described, but the IGZO film may also be patterned by dry etching.

Further, the amorphous IGZO film may also be heat-treated directly after film formation, directly after patterning, or after the fabrication of the TFT. By administering this heat treatment, it is possible to improve the TFT characteristics such as the carrier concentration, the electrical conductivity, the threshold voltage, the mobility, and the S value of the amorphous IGZO film.

The temperature of the heat treatment of the amorphous IGZO film exceeds room temperature (e.g., 25° C.) and is less than 700° C., and the amorphous IGZO film is preferably heat-treated at a low temperature from the standpoints of heat treatment time and heat treatment cost reduction and the standpoint of increasing the types of substrates utilizable for the TFT.

Moreover, even when the heat treatment is administered to the amorphous IGZO film configuring the active layer, light absorption is reduced with respect to light whose wavelength is in the visible light short-wavelength region of 400 nm to 420 nm. Further, the optical band gap of the amorphous IGZO film tends to increase albeit slightly, so it does not fall in comparison to the amorphous IGZO film before the heat treatment.

(Source and Drain Electrodes)

A metal film for forming the source and drain electrodes is formed on the active layer and the gate insulating film.

The metal film is conductive as an electrode and a wire, and it suffices for the metal film to be formed so as to cover the active layer by a metal that can be patterned by etching. Specifically, examples include metals such as Al, Mo, Cr, Ta, Ti, Au, and Ag, alloys such as Al—Nd and APC, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these.

In particular, from the standpoints of formability, conductivity, and patternability, it is preferable to form and laminate, by a technique such as sputtering or deposition, a layer comprising Al or a metal whose main component is Al and includes at least one of Nd, Y, Zr, Ta, Si, W, and Ni (an Al metal film), or, from the oxide semiconductor film side, a first layer comprising a metal whose main component is Al and includes at least one of Nd, Y, Zr, Ta, Si, W, and Ni and a second layer whose main component is Mo or Ti. Here, the "main component" is a component that has the largest inclusion amount (mass ratio) of the components configuring the metal film, and the main component is preferably equal to or greater than 50% by mass and more preferably equal to or greater than 90% by mass.

In the case of a top-contact type, the active layer is already formed, so there are no restrictions on the thickness of the metal film such as there are when forming the active layer after the source and drain electrodes, and the metal film can be formed thick. Considering formability, patternability resulting from etching, and conductivity (making it low-resistance), the total thickness of the metal film that becomes the source and drain electrodes and the wires connecting thereto is preferably from 10 nm to 1000 nm. A top-contact type is a configuration where the active layer is formed before the source and drain electrodes are formed and where the top surface of the active layer contacts the source and drain electrodes.

Further, when the Al metal film (first layer) and the Mo metal film or Ti metal film (second layer) whose main component is Mo or Ti are laminated, the thickness of the first layer is preferably from 10 nm to 1000 nm and the thickness of the second layer is preferably 1 nm to 300 nm.

Next, the metal film is etched and patterned to thereby form the source electrode and the drain electrode that contact the active layer. Here, at least one of the source electrode and the drain electrode is formed by forming a resist mask by photolithography on the portion where the metal film is to be left, using an acid solution where acetic acid or sulfuric acid has been added to phosphoric acid and nitric acid, and performing etching. From the standpoint of simplifying the process, the source and drain electrodes and the wires (data wires, etc.) connecting to these electrodes are preferably patterned at the same time.

The present invention is not limited to the embodiment described above. For example, a case where the metal film is wet-etched and patterned has been described, but the metal film may also be patterned by dry etching.

3. Display Device

Next, a bottom-emission organic EL display device will be described as one example of a display device pertaining to the exemplary embodiment of the present invention.

The bottom-emission organic EL display device is equipped with a substrate, the aforementioned field-effect transistor which is placed on the substrate and has a bottom-gate structure, and an organic electroluminescent element that is electrically connected to the field-effect transistor on the substrate, wherein light emitted from the organic electroluminescent element is produced from the substrate side.

Figure 3:
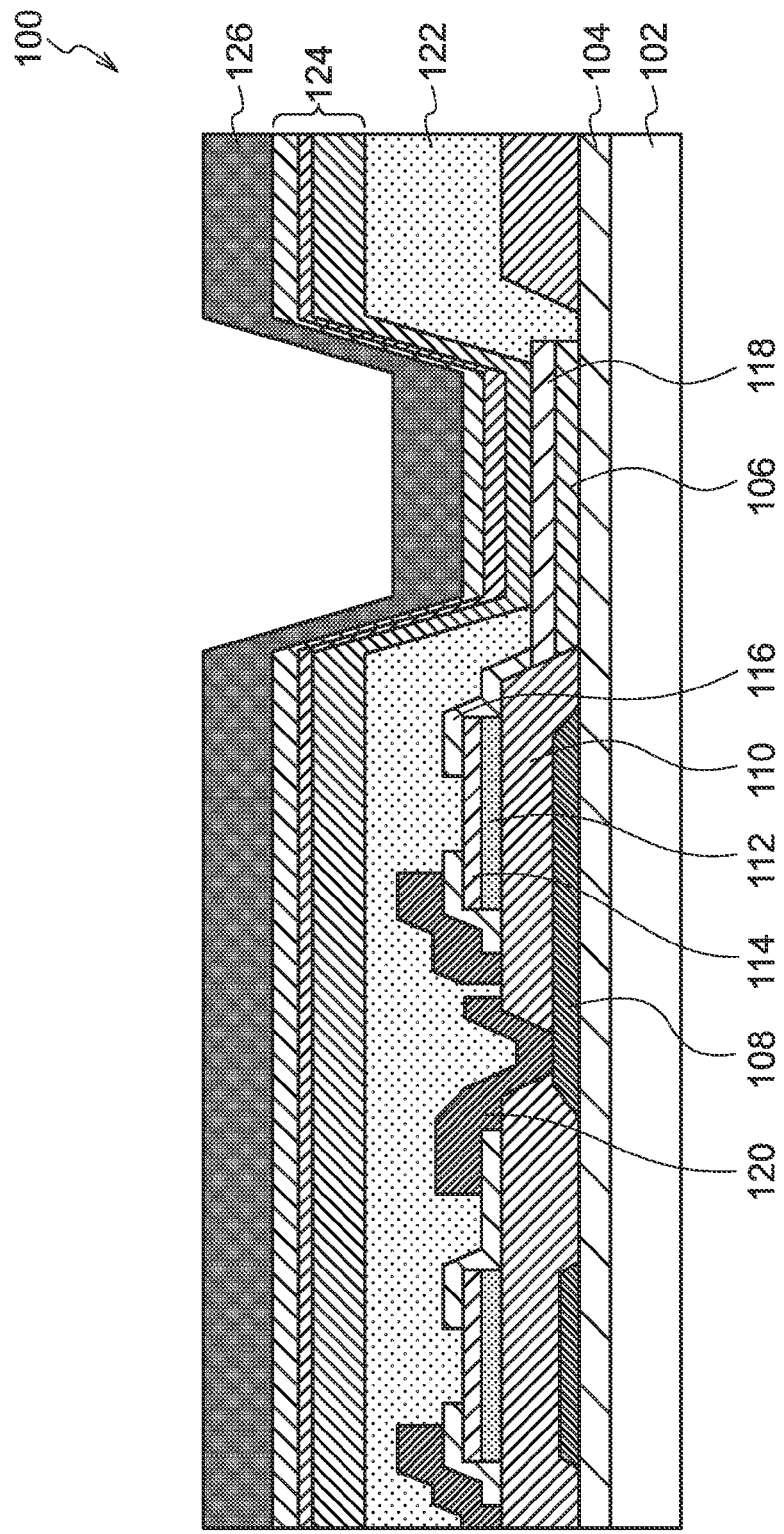
FIG. 3 is a schematic diagram showing a bottom-emission organic EL display device as one example of a display device pertaining to the exemplary embodiment of the present invention.

FIG. 3 is a schematic diagram showing a bottom-emission organic EL display device 100 as one example of the display device pertaining to the exemplary embodiment of the present invention.

In the bottom-emission organic EL display device 100, a substrate 102 has a substrate insulating film 104 on a flexible support body such as a PEN film. A color filter layer 106 that has been patterned is disposed thereon. There is a gate electrode 108 on a drive TFT portion, and a gate insulating film 110 is disposed on the gate electrode 108. A connection hole is formed in part of the gate insulating film 110 for electrical connection. An active layer 112 pertaining to the present exemplary embodiment is disposed on the drive TFT portion, and a source electrode 114 and a drain electrode 116 are disposed thereon. The drain electrode 116 and an organic EL element pixel electrode (anode) 118 are a continuous single body and are formed by the same material and the same process. A drain electrode of a switching TFT and a drive TFT are electrically connected in a connection hole by a connection electrode 120. Moreover, excluding the portion where an organic EL element of a pixel electrode portion is formed, the entirety is covered by an insulating film 122. An organic layer 124 including a light emitting layer and a cathode 126 are disposed on the pixel electrode portion, and an organic EL element portion is formed.

Additionally, in the bottom-emission organic EL display device 100 shown in FIG. 3, light generated by the light emitting layer is transmitted through the pixel electrode 118, changed by the color filter layer 106, is transmitted through the substrate 102, and is produced to the outside.

Here, according to the organic EL display device 100 of the exemplary embodiment of the present invention, the active layer 112 becomes irradiated with light including blue light generated from the light emitting layer, but the TFT can stably operate without being affected by the light with which it is irradiated because the TFT has the active layer 112 comprising the aforementioned amorphous oxide semiconductor material where light absorption is reduced with respect to the visible light short-wavelength region. Further, a reduction in the number of fabrication steps and a reduction in costs can be expected because it is no longer necessary to use means for blocking the light proceeding toward the TFT as in patent document 1.

4. Application

The aforementioned organic EL display device 100 has a wide field of application, including mobile telephone displays, personal digital assistants (PDAs), computer displays, information displays in automobiles, TV monitors, or general illumination.

Further, when the field-effect transistor pertaining to the exemplary embodiment of the present invention is used outside the aforementioned organic EL display device 100, devices having excellent light transmissivity can be provided when performing device fabrication on a transparent substrate. Examples of devices having excellent light transmissivity include transparent display devices such as transparent displays and electronic paper.

In addition, the field-effect transistor pertaining to the exemplary embodiment of the present invention is also applicable to light sensors and X-ray imaging apparatus.

EXAMPLES

The amorphous oxide semiconductor material pertaining to the present invention will be described below by way of examples, but the present invention is in no way limited by these examples.

—Fabrication of Amorphous Oxide Semiconductor Materials—

Example 1

As an amorphous oxide semiconductor material pertaining to example 1 of the present invention, an IGZO film 1 having a composition ratio of In:Ga:Zn=0.7:1.3:1.0 was formed.

Specifically, the IGZO film 1 pertaining to example 1 was formed on a 25 mm$^2$ quartz glass by co-sputtering resulting from each target of $InGaZnO_4$, $ZnO$, and $Ga_2O_3$. For these targets, targets (99.99% purity) made by Toshima Manufacturing Co., Ltd. were used. When using the $InGaZnO_4$ and $Ga_2O_3$ targets, film formation was performed by RF sputtering, and when using the ZnO target, film formation was performed by DC sputtering. When using the ZnO target, generally the resistance of the ZnO is high and film formation is often performed by RF sputtering, but DC sputtering was employed because film formation by DC sputtering was possible and from the standpoint of mass productivity.

Example 2

As an amorphous oxide semiconductor material pertaining to example 2 of the present invention, an IGZO film 2 having a composition ratio of In:Ga:Zn=0.5:1.5:1.0 was formed. This IGZO film 2 was formed using the same film-forming method as in example 1 except that the composition ratio was changed.

Example 3

As an amorphous oxide semiconductor material pertaining to example 3 of the present invention, an IGZO film 3 having a composition ratio of In:Ga:Zn=0.7:1.3:2.0 was formed. This IGZO film 3 was formed using the same film-forming method as in example 1 except that the composition ratio was changed.

Comparative Example 3

As an amorphous oxide semiconductor material pertaining to comparative example 3 of the present invention, a comparative IGZO film 3 having a composition ratio of In:Ga:Zn=1.1:0.9:2.0 was formed. This comparative IGZO film 3 was formed using the same film-forming method as in example 1 except that the composition ratio was changed.

Comparative Example 4

As an amorphous oxide semiconductor material pertaining to comparative example 4 of the present invention, a comparative IGZO film 4 having a composition ratio of In:Ga:Zn=1.0:1.0:2.0 was formed. This comparative IGZO film 4 was formed using the same film-forming method as in example 1 except that the composition ratio was changed.

The film formation conditions of the IGZO films 1 to 4 and the comparative IGZO films 1 to 4 pertaining to examples 1 to 4 and comparative examples 1 to 4 were as shown in Table 1.

TABLE 1

| Sample Name | In:Ga:Zn | Final Vacuum (Pa) | Ar/O$_2$ (sccm) | Film Formation Pressure (Pa) | RF Power (W) InGaZnO$_4$ | Ga$_2$O$_3$ | DC Power (W) ZnO |
|---|---|---|---|---|---|---|---|
| Comparative IGZO Film 1 | 1.1:0.9:1.0 | <2 × 10$^{-5}$ | 100/0.9 | 0.388 to 0.407 | 200 | 0 | 3.5 |
| Comparative IGZO Film 2 | 1.0:1.0:1.0 | | | | | 63 | 4.3 |
| IGZO Film 1 | 0.7:1.3:1.0 | | | | | 119 | 11.3 |
| IGZO Film 2 | 0.5:1.5:1.0 | | | | | 172 | 18.1 |
| Comparative IGZO Film 3 | 1.1:0.9:2.0 | | | | | 0 | 17 |
| Comparative IGZO Film 4 | 1.0:1.0:2.0 | | | | | 63 | 19.0 |
| IGZO Film 3 | 0.7:1.3:2.0 | | | | | 119 | 31.1 |
| IGZO Film 4 | 0.5:1.5:2.0 | | | | | 170 | 49.8 |

Example 4

As an amorphous oxide semiconductor material pertaining to example 4 of the present invention, an IGZO film 4 having a composition ratio of In:Ga:Zn=0.5:1.5:2.0 was formed. This IGZO film 4 was formed using the same film-forming method as in example 1 except that the composition ratio was changed.

Comparative Example 1

As an amorphous oxide semiconductor material pertaining to comparative example 1 of the present invention, a comparative IGZO film 1 having a composition ratio of In:Ga:Zn=1.1:0.9:1.0 was formed. This comparative IGZO film 1 was formed using the same film-forming method as in example 1 except that the composition ratio was changed.

Comparative Example 2

As an amorphous oxide semiconductor material pertaining to comparative example 2 of the present invention, a comparative IGZO film 2 having a composition ratio of In:Ga:Zn=1.0:1.0:1.0 was formed. This comparative IGZO film 2 was formed using the same film-forming method as in example 1 except that the composition ratio was changed.

—Fabrication of Field-Effect Transistors—

Example 5

As a field-effect transistor pertaining to example 5 of the present invention, a TFT 1 whose active layer comprised an IGZO film having a composition ratio of In:Ga:Zn=0.7:1.3:1.0 was fabricated.

Specifically, an IGZO film (film thickness of 50 nm) having the above composition ratio was formed on an Si substrate having a thermally-oxidized film, and thereafter patterning was administered by a mixed-acid aluminum etching liquid to fabricate the active layer. The film-forming method and conditions of the IGZO film configuring the active layer were the same as in example 1. However, in relation to film thickness, using the film thickness and the film formation time of the IGZO film that was formed in example 1 as a reference, the film formation time was adjusted such that the film thickness became 50 nm. In relation also to the field-effect transistors described below whose composition ratios were changed, the film formation time was adjusted such that the film thickness became 50 nm. Thereafter, film formation was performed using ITO for the source and drain electrodes, whereby the TFT 1 whose gate electrode comprised the Si substrate and whose gate insulating film comprised the thermally-oxidized film (100 nm) was fabricated.

Example 6

As a field-effect transistor pertaining to example 6 of the present invention, a TFT 2 whose active layer comprised an IGZO film having a composition ratio of In:Ga:Zn=0.5:1.5:1.0 was fabricated. This TFT 2 was fabricated using the same fabrication method and conditions as in example 5 except that the composition ratio of the active layer and the film formation time were changed.

Example 7

As a field-effect transistor pertaining to example 7 of the present invention, a TFT 3 whose active layer comprised an IGZO film having a composition ratio of In:Ga:Zn=0.7:1.3:2.0 was fabricated. This TFT 3 was fabricated using the same fabrication method and conditions as in example 5 except that the composition ratio of the active layer and the film formation time were changed.

Example 8

As a field-effect transistor pertaining to example 8 of the present invention, a TFT 4 whose active layer comprised an IGZO film having a composition ratio of In:Ga:Zn=0.5:1.5:2.0 was fabricated. This TFT 4 was fabricated using the same fabrication method and conditions as in example 5 except that the composition ratio of the active layer and the film formation time were changed.

Comparative Example 5

As a field-effect transistor pertaining to comparative example 5, a comparative TFT 1 whose active layer comprised an IGZO film having a composition ratio of In:Ga:Zn=1.1:0.9:1.0 was fabricated. This comparative TFT 1 was fabricated using the same fabrication method and conditions as in example 5 except that the composition ratio of the active layer and the film formation time were changed.

Comparative Example 6

As a field-effect transistor pertaining to comparative example 6, a comparative TFT 2 whose active layer comprised an IGZO film having a composition ratio of In:Ga:Zn=1.0:1.0:1.0 was fabricated. This comparative TFT 2 was fabricated using the same fabrication method and conditions as in example 5 except that the composition ratio of the active layer and the film formation time were changed.

Comparative Example 7

As a field-effect transistor pertaining to comparative example 7, a comparative TFT 3 whose active layer comprised an IGZO film having a composition ratio of In:Ga:Zn=1.1:0.9:2.0 was fabricated. This comparative TFT 3 was fabricated using the same fabrication method and conditions as in example 5 except that the composition ratio of the active layer and the film formation time were changed.

Comparative Example 8

As a field-effect transistor pertaining to comparative example 8, a comparative TFT 4 whose active layer comprised an IGZO film having a composition ratio of In:Ga:Zn=1.1:1.0:2.0 was fabricated. This comparative TFT 4 was fabricated using the same fabrication method and conditions as in example 5 except that the composition ratio of the active layer and the film formation time were changed.

—Heat Treatment of Amorphous Oxide Semiconductor Materials and Field-Effect Transistors—

Example 9

As an amorphous oxide semiconductor material pertaining to example 9 of the present invention, a heat treatment was administered to the amorphous oxide semiconductor material of example 1 ($b=1.3$, $c=1.0$) to form an IGZO film 5.

The heat treatment of the amorphous oxide semiconductor material was performed after the amorphous oxide semiconductor material was placed in an oxidizing atmosphere control furnace (Fujifilm Corporation custom-made furnace) and oxygen substitution was performed at a flow rate of 200 sccm. The heat treatment conditions were such that the temperature rise rate was 8.3° C./min, the temperature was raised from room temperature to 180° C., the temperature of 180° C. was held for one hour, thereafter, the amorphous oxide semiconductor material was allowed to cool naturally, and the above-described oxygen continued to flow from the start of the heat treatment to until the removal of the amorphous oxide semiconductor material.

Example 10

As an amorphous oxide semiconductor material pertaining to example 10 of the present invention, a heat treatment was administered to the amorphous oxide semiconductor material of example 2 ($b=1.5$, $c=1.0$) to form an IGZO film 6.

The method and conditions of the heat treatment of the amorphous oxide semiconductor material were the same as the method and conditions of example 9.

Comparative Example 9

As an amorphous oxide semiconductor material pertaining to comparative example 9, a heat treatment was administered to the amorphous oxide semiconductor material of comparative example 1 ($b=0.9$, $c=1.0$) to form a comparative IGZO film 5.

The method and conditions of the heat treatment of the amorphous oxide semiconductor material were the same as the method and conditions of example 5.

Comparative Example 10

As an amorphous oxide semiconductor material pertaining to comparative example 10, a heat treatment was administered to the amorphous oxide semiconductor material of comparative example 2 ($b=1.0$, $c=1.0$) to form a comparative IGZO film 6.

The method and conditions of the heat treatment of the amorphous oxide semiconductor material were the same as the method and conditions of example 5.

Example 11

As a field-effect transistor pertaining to example 11 of the present invention, a heat treatment was administered to the field-effect transistor of example 5 (composition of active layer: $b=1.3$, $c=1.0$) to fabricate a TFT 5.

The heat treatment of the field-effect transistor was performed after the field-effect transistor was placed in a desktop muffle furnace (KDF-75 made by Dengen Co., Ltd.) and oxygen substitution was performed at a flow rate of 200 sccm. The heat treatment conditions were such that the temperature rise rate was 8.3° C./min, the temperature was raised from room temperature to 180° C., the temperature of 180° C. was held for one hour, thereafter, the field-effect transistor was allowed to cool naturally, and the above-described oxygen continued to flow from the start of the heat treatment to until the removal of the field-effect transistor.

Comparative Example 11

As a field-effect transistor pertaining to comparative example 11, a heat treatment was administered to the field-effect transistor of comparative example 5 (composition of active layer: b=0.9, c=1.0) to fabricate a comparative TFT 5.

The method and conditions of the heat treatment of the field-effect transistor were the same as the method and conditions of example 11.

—Thin Film Evaluation—

With respect to the IGZO films 1 to 4 and the comparative IGZO films 1 to 4 of examples 1 to 4 and comparative examples 1 to 4, X-ray diffraction measurement and evaluations of the composition ratio, the film thickness, the optical properties and the electrical properties were performed. Table 2 shows the results of the evaluations. The evaluations will be described in detail below.

As shown in Table 2, as a result of deciding the composition ratios, it was confirmed that the IGZO films 1 to 4 and the comparative IGZO films 1 to 4 had the composition ratios shown above.

Figure 4:
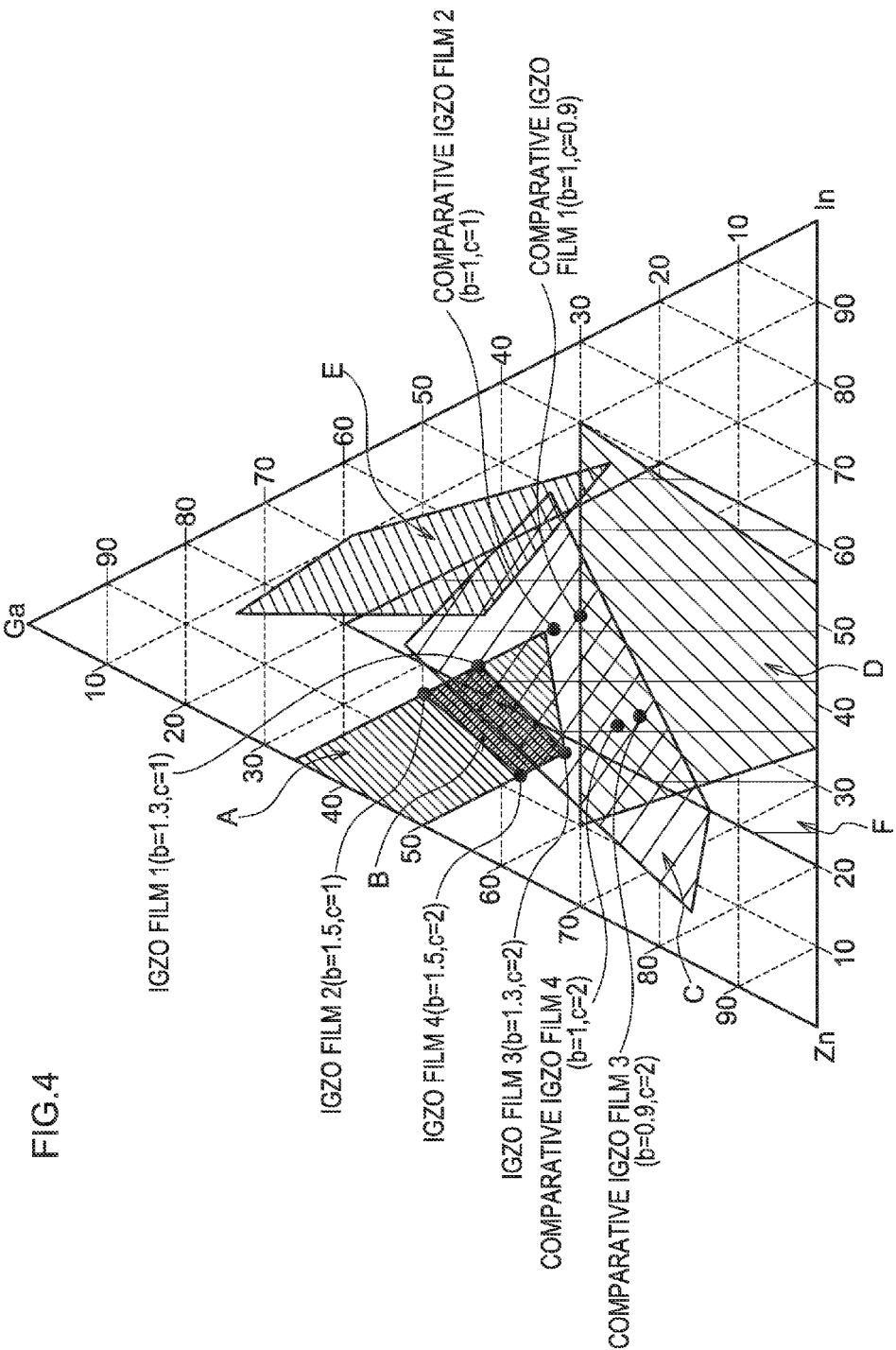
FIG. 4 is a diagram where the results of analyzing the composition ratios of IGZO films 1 to 4 pertaining to examples 1 to 4 and comparative IGZO films 1 to 4 pertaining to comparative examples 1 to 4 are shown together in a phase diagram.

FIG. 4 is a diagram where the results of analyzing the composition ratios of the IGZO films 1 to 4 and the comparative IGZO films 1 to 4 are shown together in a phase diagram.

Range A in the diagram is the composition range of the IGZO films pertaining to the examples of the present invention, and range B is a preferred composition range of the IGZO films of the examples. Range C is the composition range of the IGZO film described in patent document 3, and range D is the composition range of the IGZO film described in patent document 4. Further, range E is the composition range of the IGZO film described in patent document 5. Moreover, range F is the composition ratio of the IGZO film described in patent document 6.

As shown in FIG. 4, the composition ratios of the IGZO films 1 to 4 pertaining to examples 1 to 4 are included in range A inside the phase diagram. Further, the composition ratios of the IGZO films 1 to 4 pertaining to examples 1 to 4 are also included in range B, which is a preferred range, inside the phase diagram. In particular, the composition ratios of the IGZO films 2 to 4 pertaining to examples 2 to 4 are not included in range F. That is, they are in the range of a+b=2 and 1.3≤b≤1.5 and c>−5b+8 and 1≤c≤2.

The composition ratios of the comparative IGZO films 1 to 4 pertaining to comparative examples 1 to 4 are not included

TABLE 2

| Sample Name | In:Ga:Zn | b | c | Crystallinity | Film Thickness (nm) | Sheet Resistance (Ω/sq) | Resistivity (Ω·cm) | Electrical Conductivity (S/cm) | Optical Band Gap (Eg) |
|---|---|---|---|---|---|---|---|---|---|
| Comparative IGZO Film 1 | 1.1:0.9:1.0 | 0.9 | 1.0 | Amorphous | 107.5 | $1.14 \times 10^9$ | $1.22 \times 10^4$ | $8.17 \times 10^{-5}$ | 3.77 |
| Comparative IGZO Film 2 | 1.0:1.0:1.0 | 1.0 | | Amorphous | 99.4 | $1.38 \times 10^9$ | $1.37 \times 10^4$ | $7.31 \times 10^{-5}$ | 3.81 |
| IGZO Film 1 | 0.7:1.3:1.0 | 1.3 | | Amorphous | 101.2 | $1.16 \times 10^{12}$ | $1.17 \times 10^7$ | $8.52 \times 10^{-8}$ | 3.97 |
| IGZO Film 2 | 0.5:1.5:1.0 | 1.5 | | Amorphous | 100.0 | $6.56 \times 10^{13}$ | $6.56 \times 10^8$ | $1.52 \times 10^{-9}$ | 4.05 |
| Comparative IGZO Film 3 | 1.1:0.9:2.0 | 0.9 | 2.0 | Amorphous | 104.9 | $6.02 \times 10^9$ | $6.31 \times 10^4$ | $1.58 \times 10^{-5}$ | 3.61 |
| Comparative IGZO Film 4 | 1.0:1.0:2.0 | 1.0 | | Amorphous | 102.7 | $8.06 \times 10^9$ | $8.28 \times 10^4$ | $1.21 \times 10^{-5}$ | 3.68 |
| IGZO Film 3 | 0.7:1.3:2.0 | 1.3 | | Amorphous | 99.5 | $6.44 \times 10^{10}$ | $6.40 \times 10^5$ | $1.56 \times 10^{-6}$ | 3.79 |
| IGZO Film 4 | 0.5:1.5:2.0 | 1.5 | | Amorphous | 98.6 | $5.89 \times 10^{11}$ | $5.81 \times 10^6$ | $1.72 \times 10^{-7}$ | 3.85 |

(X-Ray Diffraction Measurement)

The measurement of the diffraction intensity of all of the IGZO films that were formed was performed by well-known X-ray diffraction using the Rint-Ultima III measurement device (made by Rigaku Corporation). As shown in Table 2, as a result of the measurement, it was confirmed that all of the IGZO films were amorphous.

(Evaluation of Composition Ratios)

The composition ratios of all of the IGZO films that were formed were decided by fluorescent X-ray analysis (device: Axios made by PANalytical). Specifically, first, the fluorescent X-ray intensity of a standard sample where the element concentrations of the elements of In, Ga and Zn were decided by ICP was measured. Next, a standard curve was generated between each element concentration and the fluorescent X-ray intensity of the standard sample. Finally, fluorescent X-ray analysis of an unknown sample was performed and the generated standard curve was used to decide the composition ratio.

in ranges A and B inside the phase diagram but are included in ranges C, D, or F inside the phase diagram.

(Film Thickness Evaluation)

The film thicknesses of all of the IGZO films that were formed were, like the decision of the composition ratios, decided by fluorescent X-ray analysis. As shown in Table 2, as a result of deciding the film thicknesses, it was confirmed that all of the thicknesses were about 100 nm.

(Optical Properties)

The optical band gaps of all of the IGZO films were calculated by extrapolating a Tauc plot resulting from $(\alpha h \nu)^2$ vs $h\nu$ with reference to reference documents 1 and 2 listed below. In order to create this Tauc plot, a spectrophotometer (U3310, U4000 made by Hitachi, Ltd.) was used to perform transmission and reflection measurement.

Reference Document 1: Journal of Non-Crystalline Solids, 8-10 (1972), pp. 569 to 585

Reference Document 2: Journal of Applied Physics, 102, 113525 (2007), pp. 1 to 8

Figure 5:
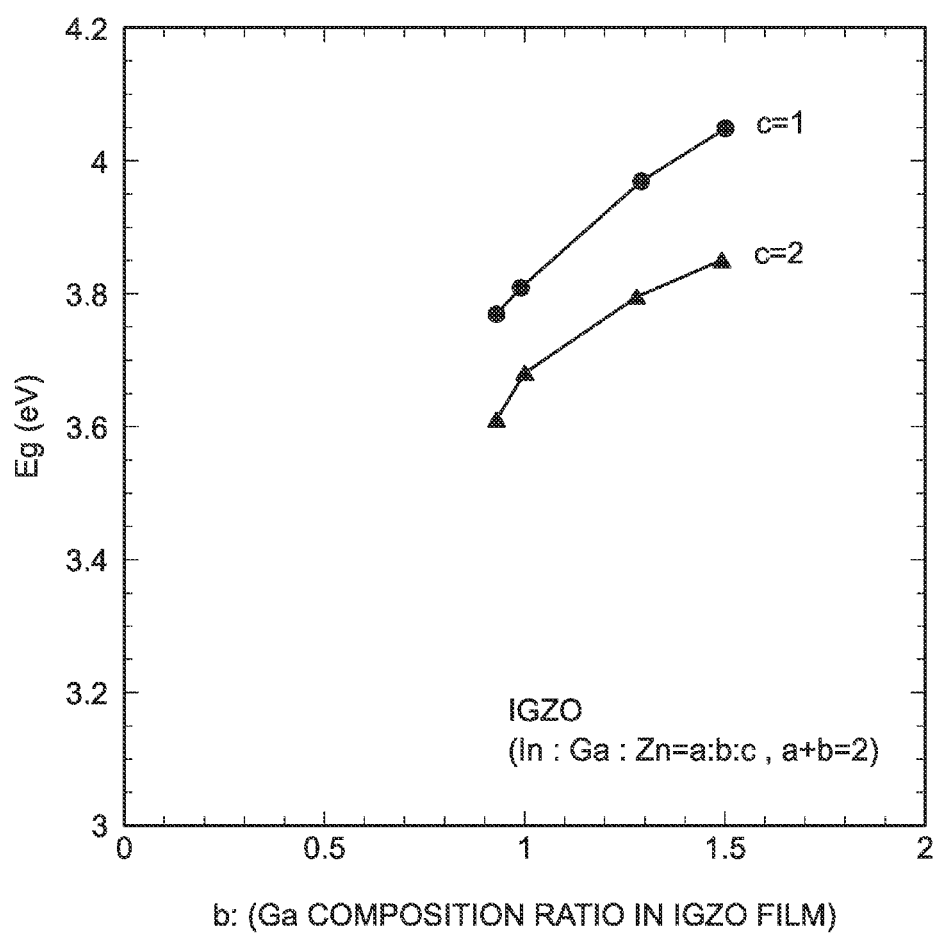
FIG. 5 is a graph where the results of calculating the optical band gaps of the IGZO films 1 to 4 pertaining to examples 1 to 4 and the comparative IGZO films 1 to 4 pertaining to comparative examples 1 to 4 are plotted, with the horizontal axis representing the composition ratio of Ga (b value) and the vertical axis representing the optical band gap.

FIG. 5 shows a graph where the results of calculating the optical band gaps of the IGZO films are plotted, with the horizontal axis representing the composition ratio of Ga (b value) and the vertical axis representing the optical band gap.

As shown in FIG. 5 and Table 2, it could be confirmed that, as the composition ratio b of Ga of the IGZO films increased, the optical band gap expanded. Further, it could also be confirmed that IGZO films that are amorphous have optical band gaps that are expandable in a wider range than crystalline IGZO films (not shown). This is because unlike crystalline phases, amorphous phases have no concept called a solid solution and it is possible to increase the Ga concentration virtually infinitely.

(Electrical Properties)

The electrical conductivities of all of the IGZO films that were fabricated were calculated by deciding their sheet resistance with a resistivity meter (Mitsubishi Chemical Corporation, Hiresta MCP-HT450).

Figure 6:
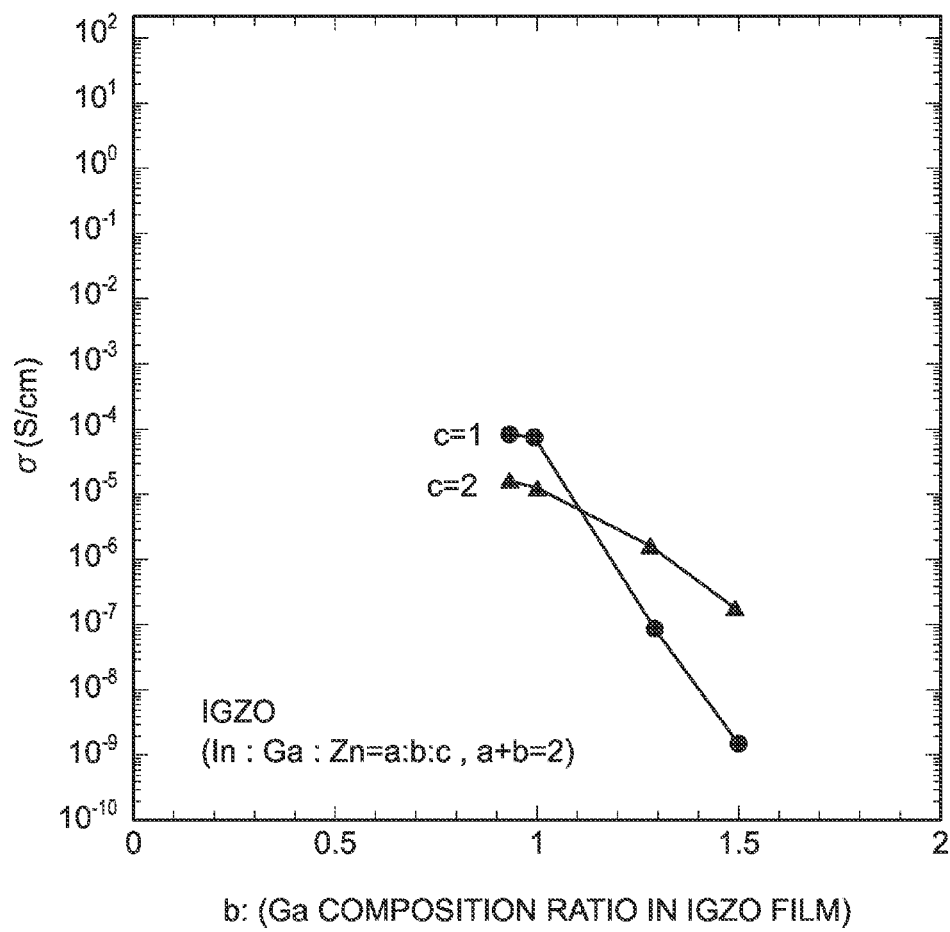
FIG. 6 is a diagram showing the relationship between the electrical conductivity σ and the composition ratio b of Ga of the IGZO films 1 to 4 pertaining to examples 1 to 4 and the comparative IGZO films 1 to 4 pertaining to comparative examples 1 to 4.

FIG. 6 shows the relationship between the electrical conductivity $\sigma$ of the IGZO films that were calculated and the composition ratio b of Ga.

As shown in FIG. 6 and Table 2, it could be confirmed that, as the composition ratio b of Ga increased, the electrical conductivity $\sigma$ decreased.

Here, referring to the transistor Vg-Id characteristics in non-patent document 2 and reference documents 3 and 4 listed below, the range of specific resistance effective as an active layer of a transistor becomes $10^2 \leq \rho \leq 10^9$ ($\Omega \cdot cm$). That is, the electrical conductivity $\sigma$ effective as an active layer of a transistor becomes $10^{-9} \leq \sigma \leq 10^{-2}$ (S/cm).

Additionally, the electrical conductivities of all of the IGZO films that were fabricated were within the aforementioned range of $10^{-9} \leq \sigma \leq 10^{-2}$ (S/cm).

Reference Document 3: Thin Solid Films, 516 (2008), p. 1516.

Reference Document 4: Appl. Phys. Lett90 212114 (2007)

—TFT Characteristics before Light Irradiation—

In relation to the TFTs 1 to 4 and the comparative TFTs 1 to 4 pertaining to examples 5 to 8 and comparative examples 5 to 8, the TFT characteristics (Vg-Id characteristics, mobility μ, threshold voltage Vth) before light irradiation were evaluated. The evaluation of the TFT characteristics was performed under a dark-place and dry-air environment after dry air was allowed to flow for 20 minutes or more. The Vg-Id characteristics were evaluated at a time when Vd=10 V.

Table 3 shows the results of evaluating the TFT characteristics in the TFTs 1 to 4 and the comparative TFTs 1 to 4.

TABLE 3

| Sample Name | In:Ga:Zn | b | c | Vth (V) | Mobility μ (cm²/S·V) | Ioff (A) |
|---|---|---|---|---|---|---|
| Comparative TFT 1 | 1.1:0.9:1.0 | 0.9 | 1.0 | 4.33 | 8.49 | $5.90 \times 10^{-14}$ |
| Comparative TFT 2 | 1.0:1.0:1.0 | 1.0 | | 5.52 | 3.16 | $5.60 \times 10^{-12}$ |
| TFT 1 | 0.7:1.3:1.0 | 1.3 | | 18.71 | 2.73 | $4.80 \times 10^{-14}$ |
| TFT 2 | 0.5:1.5:1.0 | 1.5 | | 36.15 | 0.53 | $2.60 \times 10^{-12}$ |
| Comparative TFT 3 | 1.1:0.9:2.0 | 0.9 | 2.0 | −0.67 | 5.41 | $7.60 \times 10^{-14}$ |
| Comparative TFT 4 | 1.0:1.0:2.0 | 1.0 | | 6.69 | 4.61 | $5.30 \times 10^{-12}$ |
| TFT 3 | 0.7:1.3:2.0 | 1.3 | | 11.58 | 4.84 | $1.19 \times 10^{-11}$ |
| TFT 4 | 0.5:1.5:2.0 | 1.5 | | 12.70 | 0.37 | $1.30 \times 10^{-14}$ |

Further, FIG. 7 to FIG. 12 show the TFT characteristics of the TFTs 1 to 4 and the comparative TFTs 2 and 2.

Figure 7:
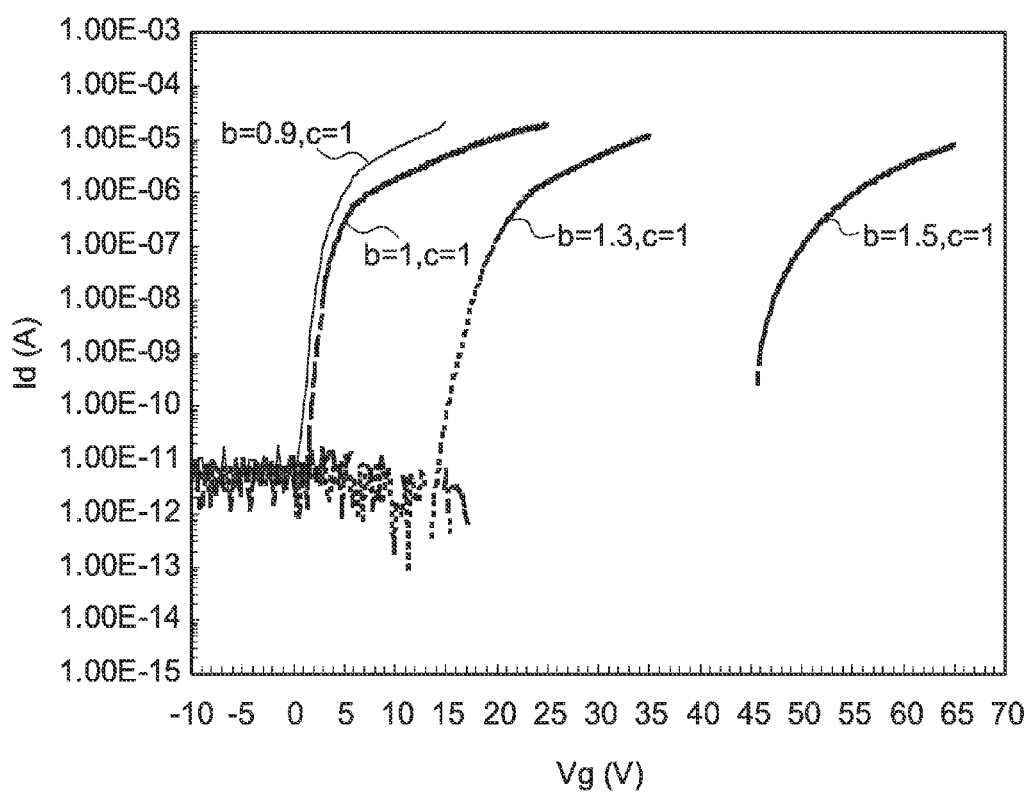
FIG. 7 is a diagram showing the Vg-Id characteristics of TFTs 1 and 2 of examples 5 and 6 and a comparative TFT 2 of comparative example 6.
Figure 8:
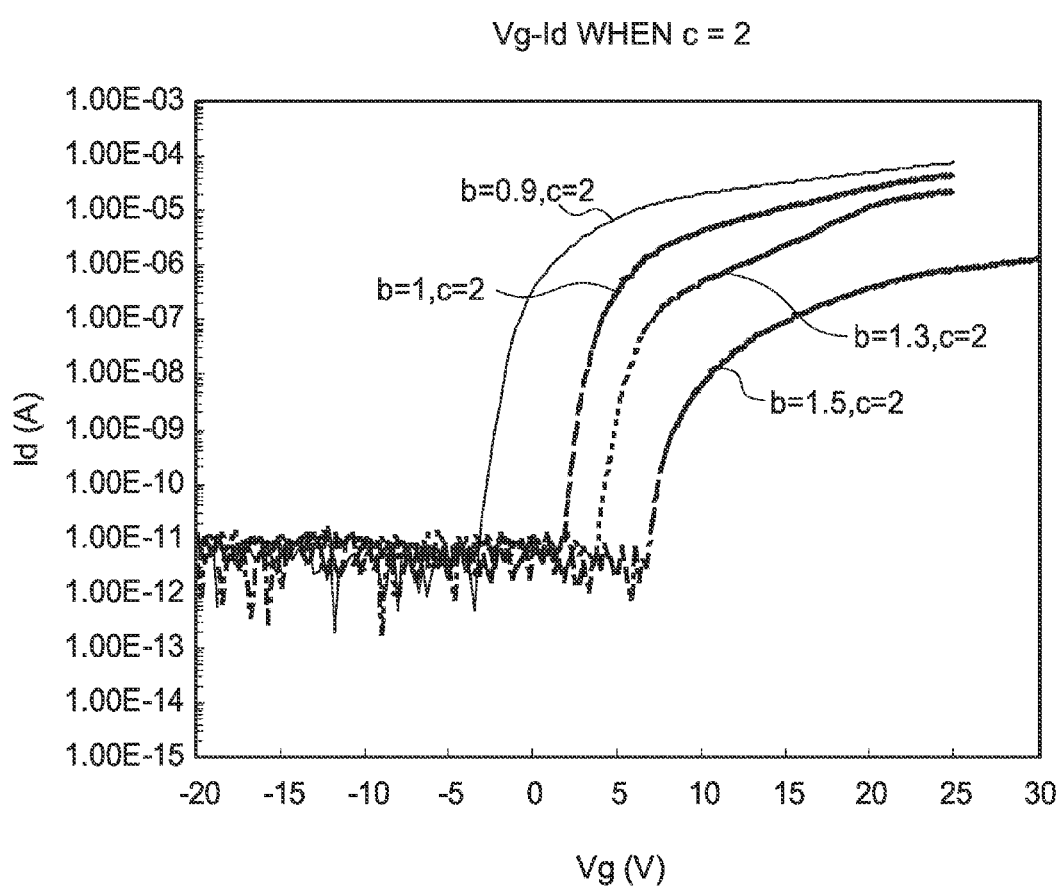
FIG. 8 is a diagram showing the Vg-Id characteristics of TFTs 3 and 4 of examples 7 and 8 and a comparative TFT 4 of comparative example 8.

FIG. 7 is a diagram showing the Vg-Id characteristics of the TFTs when the b value was changed when the c value was c=1. FIG. 8 is a diagram showing the Vg-Id characteristics of the TFTs when the b value was changed when the c value was c=2.

As shown in FIG. 7, FIG. 8 and Table 3, in both cases where the composition ratio of Zn was c=1 and c=2, it could be confirmed that, as the composition ratio b of Ga increased, the graph of the Vg-Id characteristics shifted to the plus side.

Figure 9:
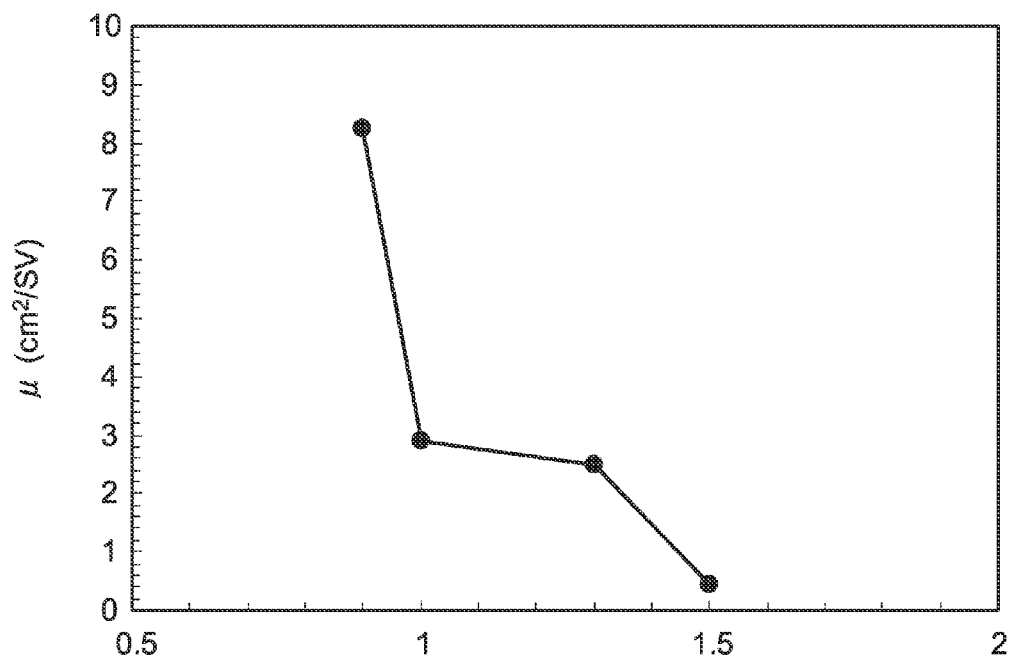
FIG. 9 is a diagram showing the mobility μ of the TFTs 1 and 2 of examples 5 and 6 and the comparative TFT 2 of comparative example 6.
Figure 10:
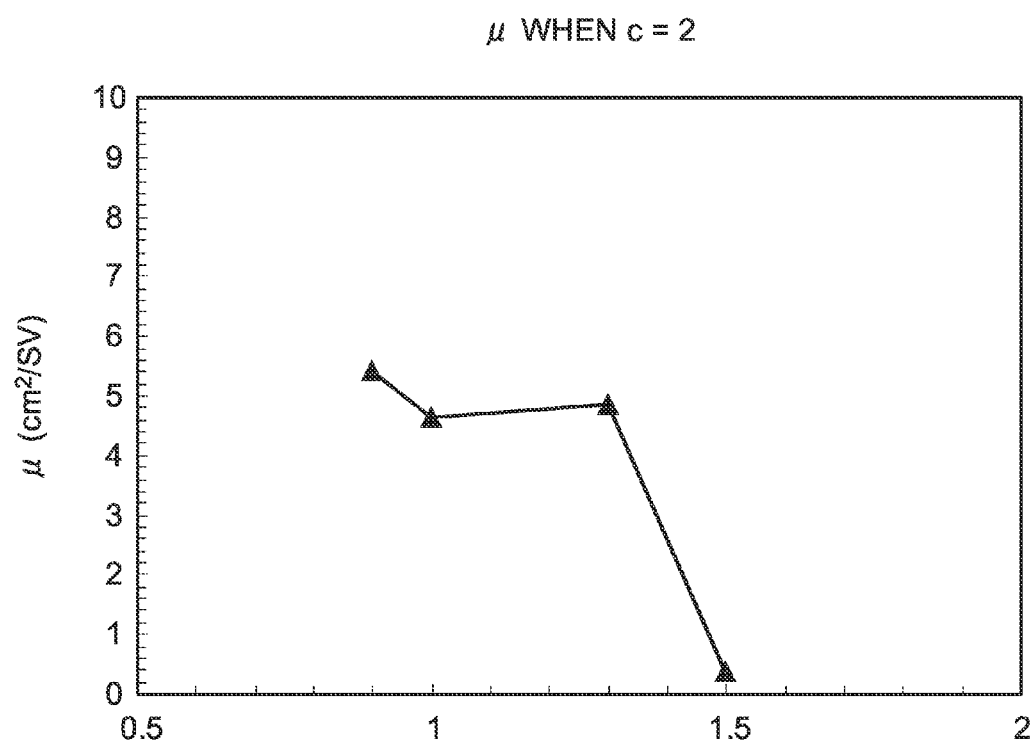
FIG. 10 is a diagram showing the mobility μ of the TFTs 3 and 4 of examples 7 and 8 and the comparative TFT 4 of comparative example 8.

Further, FIG. 9 is a diagram showing the mobilities μ of the TFTs when the b value was changed when the c value was c=1. FIG. 10 is a diagram showing the mobilities μ of the TFTs when the b value was changed when the c value was c=2.

As shown in FIG. 9, FIG. 10 and Table 3, in both cases where the composition ratio of Zn was c=1 and c=2, it could be confirmed that, as the composition ratio b of Ga increased, the mobility μ decreased.

Figure 11:
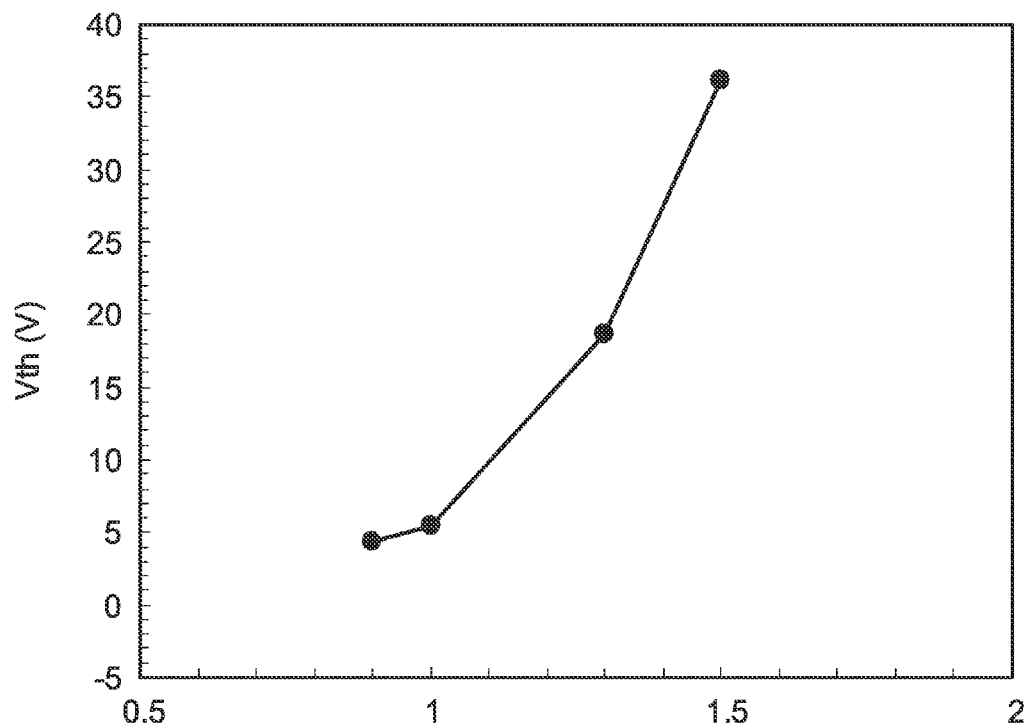
FIG. 11 is a diagram showing the threshold voltage Vth of the TFTs 1 and 2 of examples 5 and 6 and the comparative TFT 2 of comparative example 6.
Figure 12:
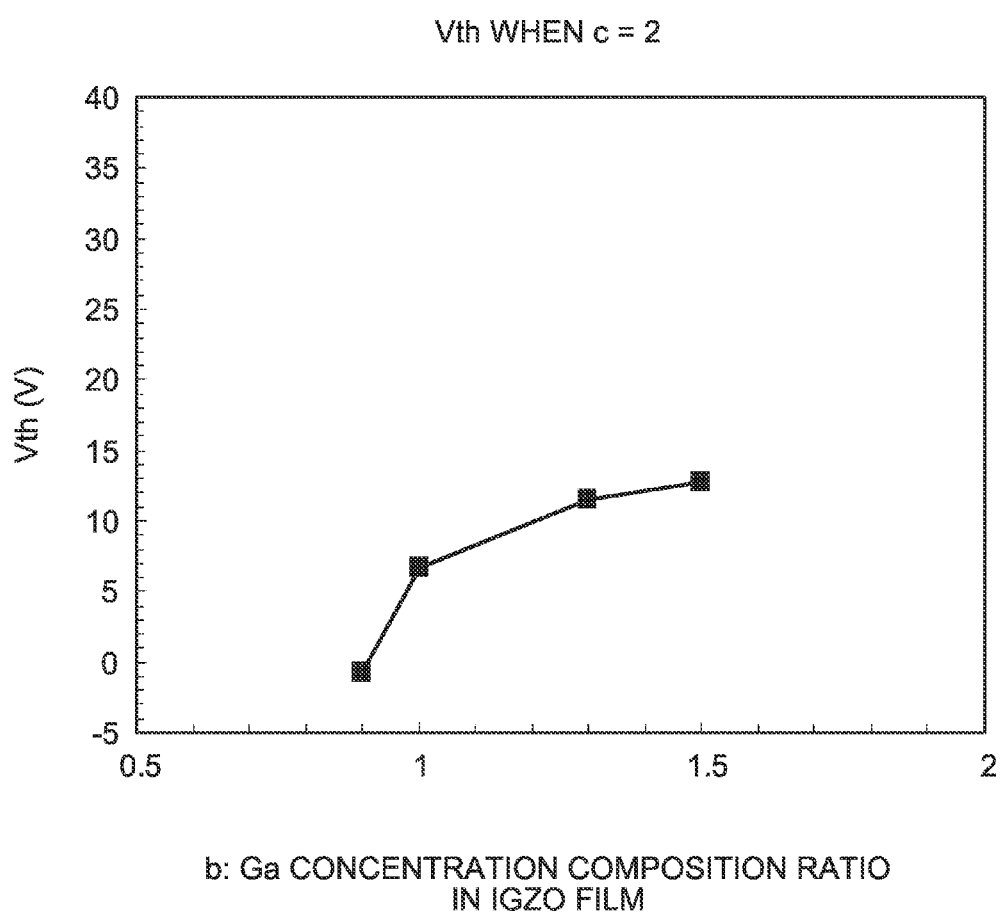
FIG. 12 is a diagram showing the threshold voltage Vth of the TFTs 3 and 4 of examples 7 and 8 and the comparative TFT 4 of comparative example 8.

Moreover, FIG. 11 is a diagram showing the threshold voltages Vth of the TFTs when the b value was changed when the c value was c=1. FIG. 12 is a diagram showing the threshold voltages Vth of the TFTs when the b value was changed when the c value was c=2.

As shown in FIG. 11, FIG. 12 and Table 3, in both cases where the composition ratio of Zn was c=1 and c=2, it could be confirmed that, as the composition ratio b of Ga increased, the threshold voltage Vth increased.

—TFT Characteristics at Time of Light Irradiation—

Figure 13:
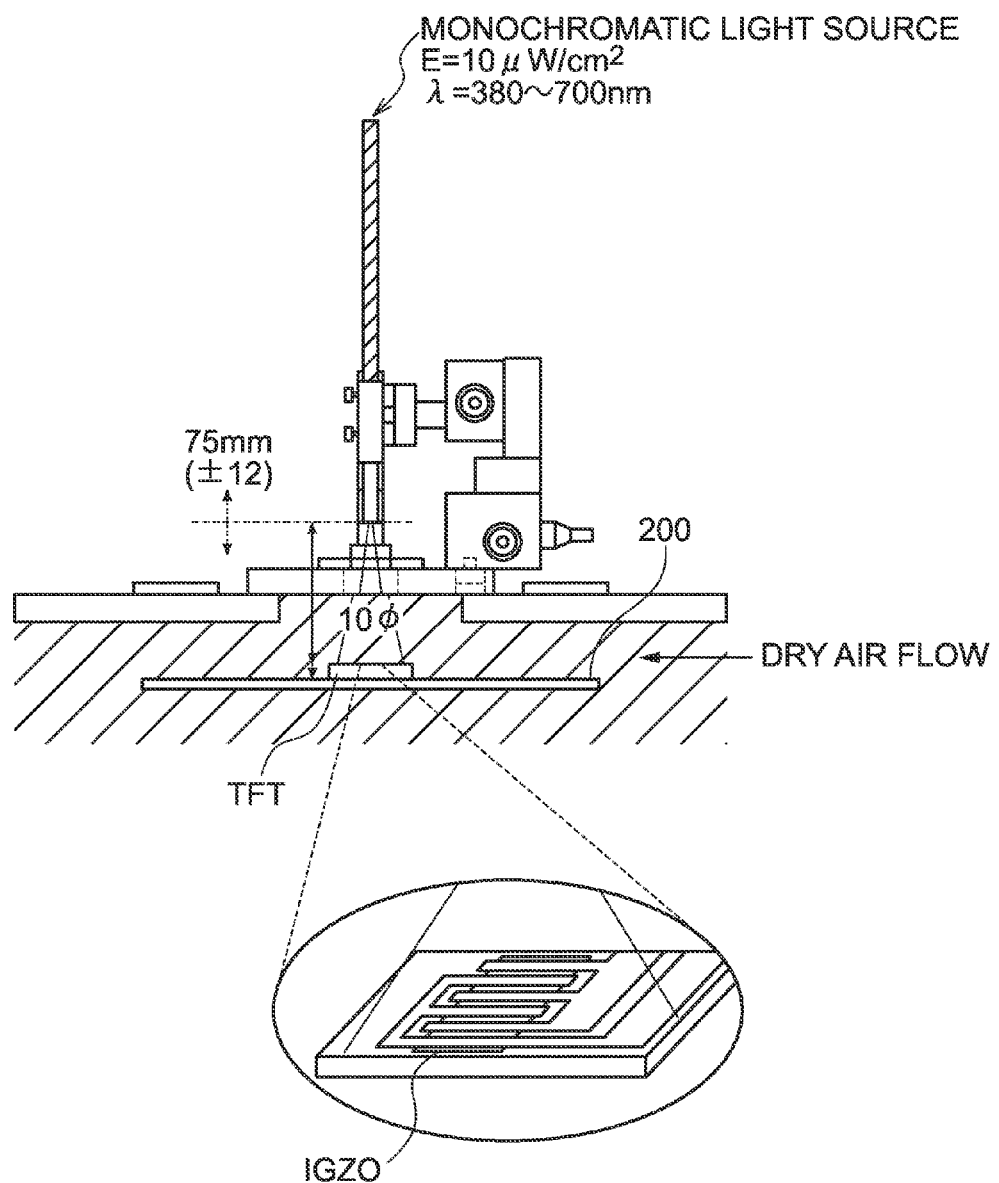
FIG. 13 is a diagram showing the general configuration of TFT property measurement at the time of light irradiation.

In relation to the TFTs 1 to 4 and the comparative TFTs 1 and 3 pertaining to examples 5 to 8 and comparative examples 5 and 7, the TFT characteristics at the time of monochromatic light irradiation were measured. FIG. 13 shows the general configuration of TFT characteristic measurement.

Specifically, as shown in FIG. 13, each of the TFTs was placed on a probe stage 200, dry air was allowed to flow for 2 hours or more, and the TFT characteristics (Vg-Id characteristics, Vg-Ig characteristics, mobility μ, threshold Vth) were measured under that dry-air environment. The measurement conditions of the monochromatic light irradiation TFT characteristics were such that Vds=10 V, the irradiation intensity of the monochromatic light source was 10 μW/cm², and the range of the wavelength λ was 380 to 700 nm. Except when noted below, all of the measurements were performed at a time when the TFTs were irradiated with monochromatic light for 10 minutes.

(Mobilities)

Figure 14:
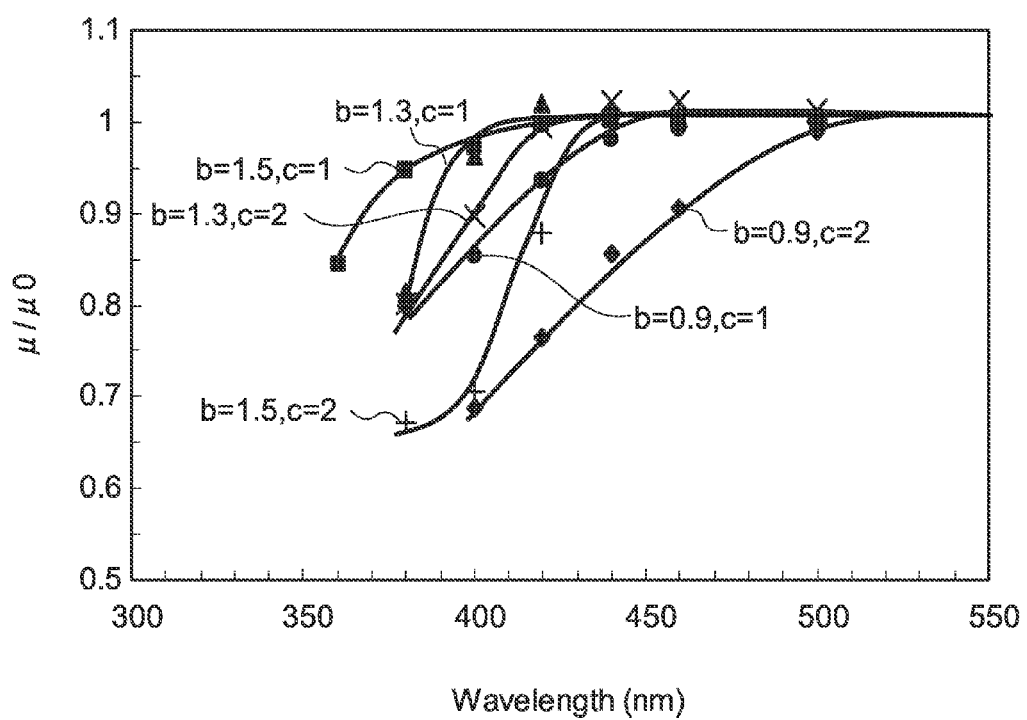
FIG. 14 is a graph where the results of measuring mobility changes are plotted, with the horizontal axis representing the wavelength (nm) and the vertical axis representing the mobility changes ($\mu/\mu_o$)

The active layers of the TFTs 1 to 4 and the comparative TFTs 1 and 3 were irradiated with monochromatic light of different wavelengths around 420 nm. Table 4 shows the results of measuring the mobility changes ($\mu/\mu_0$) at this time. Further, FIG. 14 shows a graph where these measurement results are plotted, with the horizontal axis representing the wavelength (nm) and the vertical axis representing the mobility change ($\mu/\mu_0$).

μ is the mobility of each of the TFTs (active layers) at a time when the TFT has been irradiated with monochromatic light of different wavelengths, and $\mu_0$ is the mobility of each of the TFTs (active layers) at a time when the TFT has been irradiated with monochromatic light having a wavelength of 600 nm.

TABLE 4

| Sample Name | b | c | Mobility Change μ/μ₀ at Time of 400 nm Irradiation | Mobility Change μ/μ₀ at Time after 420 nm Irradiation | Mobility Change μ/μ₀ at Time after 440 nm Irradiation |
| --- | --- | --- | --- | --- | --- |
| Comparative TFT 1 | 0.9 | 1.0 | 0.85 | 0.94 | 0.98 |
| TFT 1 | 1.3 | | 0.96 | 1.02 | 1.01 |
| TFT 2 | 1.5 | | 0.98 | 1.01 | 1.01 |
| Comparative TFT 3 | 0.9 | 2.0 | 0.69 | 0.77 | 0.86 |
| TFT 3 | 1.3 | | 0.90 | 1.00 | 1.02 |
| TFT 4 | 1.5 | | 0.70 | 0.87 | 0.99 |

From the results of Table 4 and FIG. 14, it could be confirmed that, when the wavelength of the monochromatic light was around 420 nm, as the composition ratio b of Ga increased, the mobility change decreased. Further, it was understood that, when the wavelength of the monochromatic light was around 420 nm, mobility changes in the TFTs 1 to 3 were virtually not seen.

TABLE 5

| Sample Name | b | c | 5 min Irradiation Time ΔVth (V) | 10 min Irradiation Time ΔVth (V) |
| --- | --- | --- | --- | --- |
| Comparative TFT 1 | 0.9 | 1.0 | −0.45 | −0.69 |
| TFT 1 | 1.3 | | 0.12 | 0.11 |
| TFT 2 | 1.5 | | 0.60 | 0.87 |
| Comparative TFT 3 | 0.9 | 2.0 | −0.56 | −1.08 |
| TFT 3 | 1.3 | | −0.11 | −0.21 |
| TFT 4 | 1.5 | | 0.04 | −0.10 |

Figure 15:
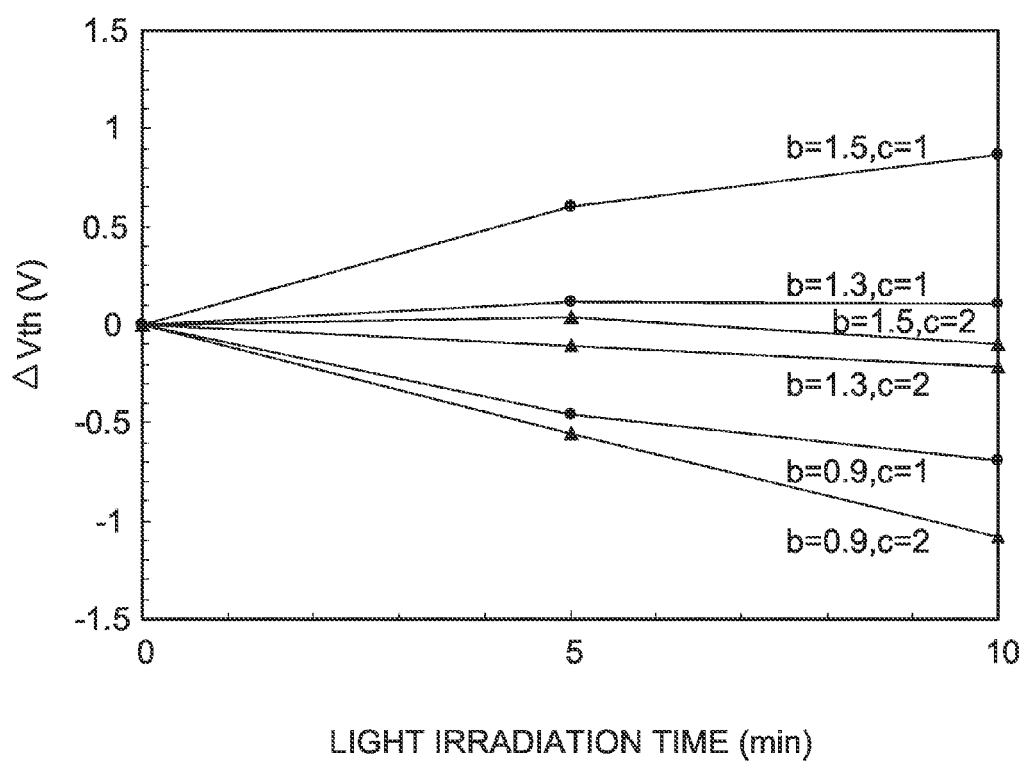
FIG. 15 is a graph where the results of measuring temporal changes in the threshold voltages are plotted, with the horizontal axis representing the light irradiation time (min) and the vertical axis representing the temporal changes in the threshold voltages (ΔVth)

From the results shown in Table 5 and FIG. 15, in the TFT 1 pertaining to example 5 and the TFT 4 pertaining to example 8, there were virtually no changes in ΔVth (V) even when the light irradiation time had gone on for 10 minutes.

(Changes in Threshold Voltages)

Figure 16:
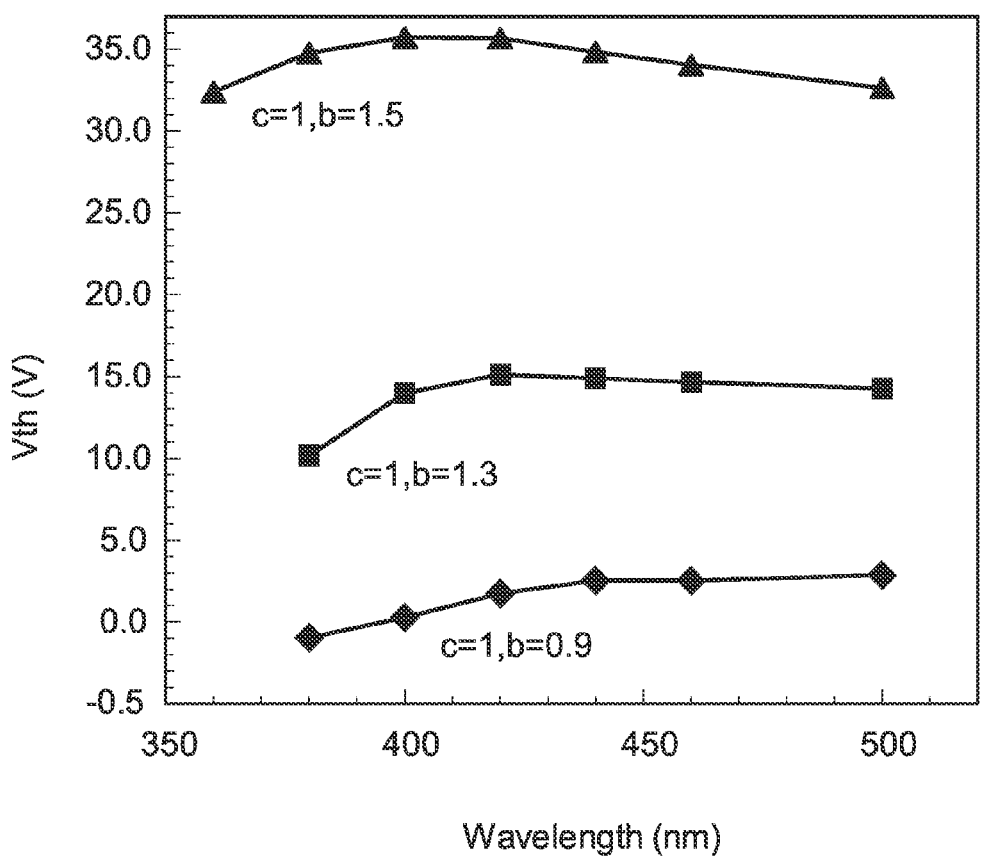
FIG. 16 is a graph where the results of measuring the threshold voltages are plotted, with the horizontal axis representing the wavelength (nm) and the vertical axis representing the threshold voltages (Vth)

The active layers of the TFTs 1 to 4 and the comparative TFTs 1 and 3 were irradiated with monochromatic light of different wavelengths. Table 6 shows the results of measuring the threshold voltages Vth at this time. Further, FIG. 16 shows a graph where these measurement results are plotted, with the horizontal axis representing the wavelength (nm) and the vertical axis representing the threshold voltage (Vth). In FIG. 16, the results of measuring the threshold voltages at a time when the composition ratio c of Zn was c=2 are omitted.

TABLE 6

| Sample Name | b | c | 360 nm Irradiation Time Vth (V) | 380 nm Irradiation Time Vth (V) | 400 nm Irradiation Time Vth (V) | 420 nm Irradiation Time Vth (V) | 440 nm Irradiation Time Vth (V) | 460 nm Irradiation Time Vth (V) | 500 nm Irradiation Time Vth (V) |
| --- | --- | --- | --- | --- | --- | --- | --- | --- | --- |
| Comparative TFT 1 | 0.9 | 1.0 | | | −0.82 | 0.29 | 1.78 | 2.44 | 2.57 | 2.77 |
| TFT 1 | 1.3 | | | 10.03 | 13.96 | 14.97 | 15.06 | 14.67 | 14.20 |
| TFT 2 | 1.5 | | 32.47 | 35.09 | 35.92 | 35.77 | 35.18 | 34.29 | 33.08 |
| Comparative TFT 3 | 0.9 | 2.0 | | | | −7.48 | −5.39 | −3.58 | −2.38 | −1.50 |
| TFT 3 | 1.3 | | | 6.87 | 8.93 | 10.46 | 10.78 | 10.72 | 10.51 |
| TFT 4 | 1.5 | | | 9.72 | 10.45 | 10.91 | 10.92 | 10.83 | 10.66 |

(Temporal Changes in Threshold Voltages)

The active layers of the TFTs 1 to 4 and the comparative TFTs 1 and 3 were irradiated with monochromatic light whose wavelength was 420 nm and the light irradiation times were changed. Table 5 shows the results of measuring the temporal changes ΔVth in the threshold voltages at this time. Further, FIG. 15 shows a graph where these measurement results are plotted, with the horizontal axis representing the light irradiation time (min) and the vertical axis representing the temporal change in the threshold voltage (ΔVth). ΔVth was measured using the threshold voltage Vth before light irradiation as a reference (zero).

(Vg-Id Characteristics)

The active layers of the TFTs 1 to 4 and the comparative TFTs 1 and 3 were irradiated with monochromatic light of different wavelengths. FIG. 17 to FIG. 22 show the results of measuring the Vg-Id characteristics at this time.

Further, on the basis of the results shown in FIG. 17 to FIG. 22, the current value at a time when Vg=−5 V was defined as an off-state current (Ioff), and the off-state currents per wavelength of the TFTs 1 to 4 and the comparative TFTs 1 and 3 were obtained. Table 7 shows the off-state currents that were obtained.

TABLE 7

| Sample Name | b | c | 380 nm Light Irradiation Ioff (A) | 400 nm Light Irradiation Ioff (A) | 420 nm Light Irradiation Ioff (A) | 440 nm Light Irradiation Ioff (A) | 460 nm Light Irradiation Ioff (A) | 500 nm Light Irradiation Ioff (A) |
|---|---|---|---|---|---|---|---|---|
| Comparative TFT 1 | 0.9 | 1.0 | $4.88 \times 10^{-9}$ | $2.74 \times 10^{-11}$ | $4.74 \times 10^{-13}$ | $1.65 \times 10^{-13}$ | $1.01 \times 10^{-13}$ | $8.00 \times 10^{-14}$ |
| TFT 1 | 1.3 | | $7.08 \times 10^{-13}$ | $1.60 \times 10^{-13}$ | $3.30 \times 10^{-14}$ | $9.10 \times 10^{-14}$ | $1.80 \times 10^{-14}$ | $9.40 \times 10^{-14}$ |
| TFT 2 | 1.5 | | | | About $10^{-12}$ | | | |
| Comparative TFT 3 | 0.9 | 2.0 | | $1.93 \times 10^{-8}$ | $1.75 \times 10^{-9}$ | $3.76 \times 10^{-12}$ | $1.53 \times 10^{-13}$ | $5.50 \times 10^{-14}$ |
| TFT 3 | 1.3 | | $2.22 \times 10^{-8}$ | $8.01 \times 10^{-9}$ | $3.70 \times 10^{-14}$ | $4.30 \times 10^{-14}$ | $5.90 \times 10^{-14}$ | $6.70 \times 10^{-14}$ |
| TFT 4 | 1.5 | | $6.62 \times 10^{-13}$ | $1.35 \times 10^{-13}$ | $2.11 \times 10^{-13}$ | $2.11 \times 10^{-13}$ | $1.99 \times 10^{-13}$ | $2.71 \times 10^{-13}$ |

From all of the results above, the following conclusions were obtained.

Figure 17:
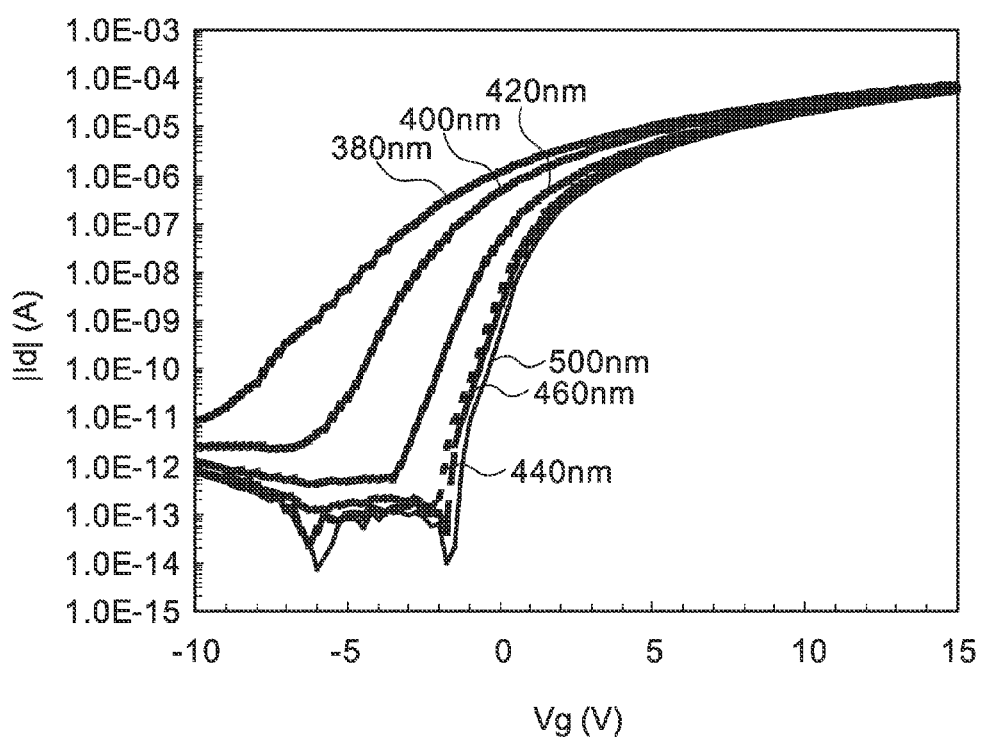
FIG. 17 is a diagram showing the results of measuring the Vg-Id characteristics when the active layer of the comparative TFT 1 is irradiated with monochromatic light of different wavelengths.

In the comparative TFT 1 pertaining to comparative example 5 (b=0.9, c=1), virtually no changes were seen in the off-state current even when the comparative TFT 1 was irradiated with monochromatic light whose wavelength was equal to or greater than 460 nm, and it was shown that the active layer was not affected by visible light whose wavelength was equal to or greater than 460 nm (see FIG. 17 and Table 7). However, it could be confirmed that the off-state current started to increase because of monochromatic light whose wavelength was equal to or less than 440 nm. For example, when used as a TFT for organic EL driving, considering that the skirt of the light emission peak of blue light of organic EL is about 420 nm, it was shown that an IGZO film where the active layer is b=0.9 and c=1 is not suitable because a change arises in the TFT characteristics because of blue light.

Figure 20:
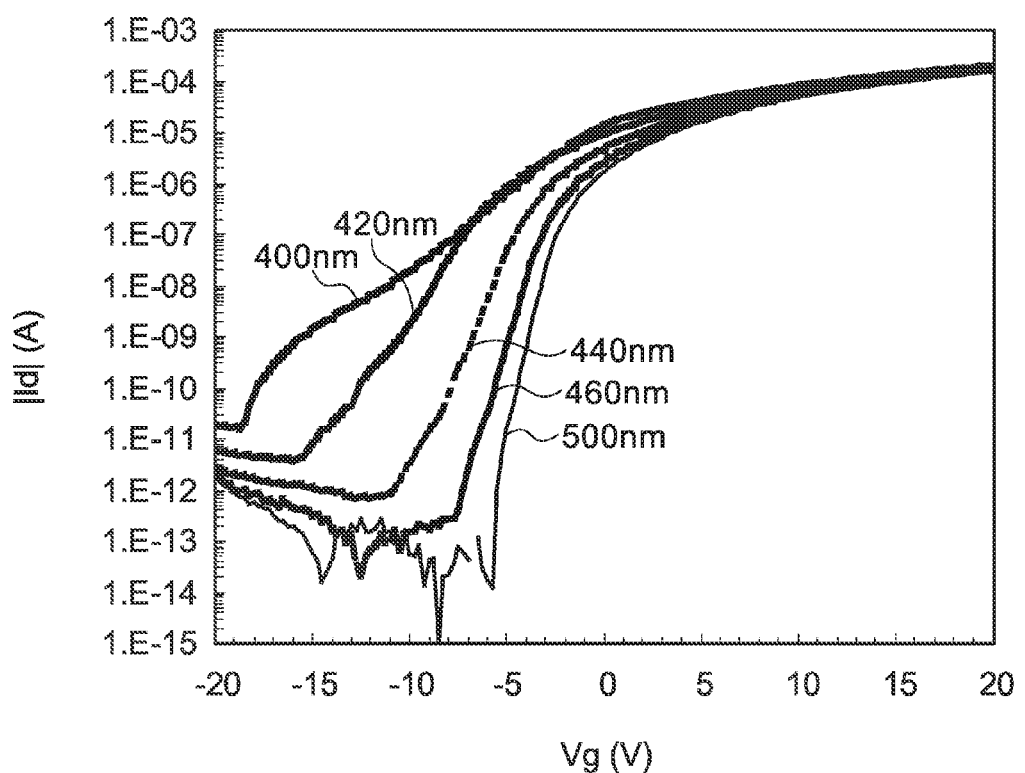
FIG. 20 is a diagram showing the results of measuring the Vg-Id characteristics when the active layer of the comparative TFT 3 is irradiated with monochromatic light of different wavelengths.
Figure 21:
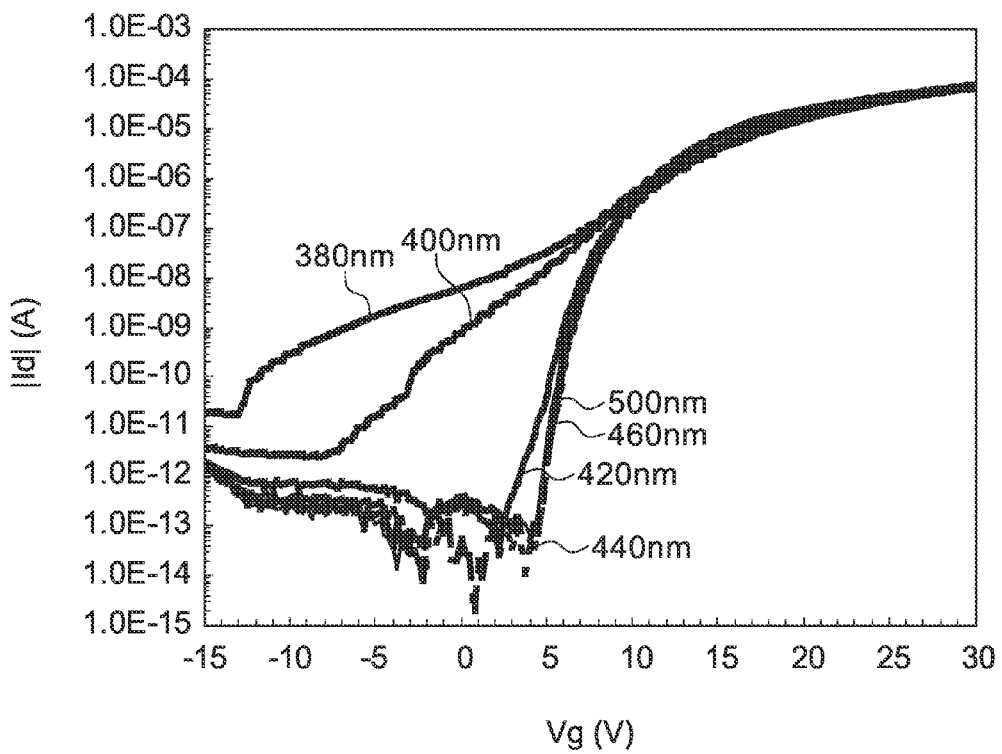
FIG. 21 is a diagram showing the results of measuring the Vg-Id characteristics when the active layer of the TFT 3 is irradiated with monochromatic light of different wavelengths.
Figure 22:
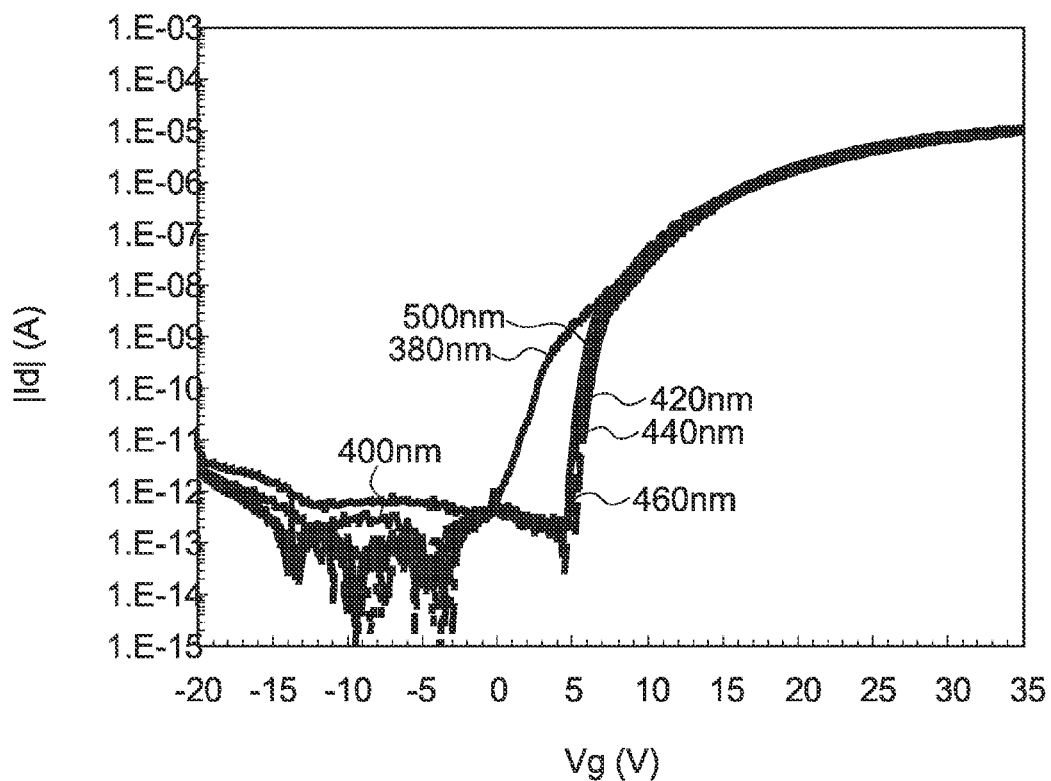
FIG. 22 is a diagram showing the results of measuring the Vg-Id characteristics when the active layer of the TFT 4 is irradiated with monochromatic light of different wavelengths.

Similarly, in the comparative TFT 3 (b=0.9, c=2) pertaining to comparative example 7, an increase in the off-state current could be confirmed when the comparative TFT 3 was irradiated with monochromatic light whose wavelength was equal to or less than 460 nm (see FIG. 20 and Table 7). In relation also to mobility and ΔVth, large changes were seen in both (see FIG. 14 and FIG. 15), so it was shown that the comparative TFT 3 was not suited for a TFT for organic EL driving.

Figure 18:
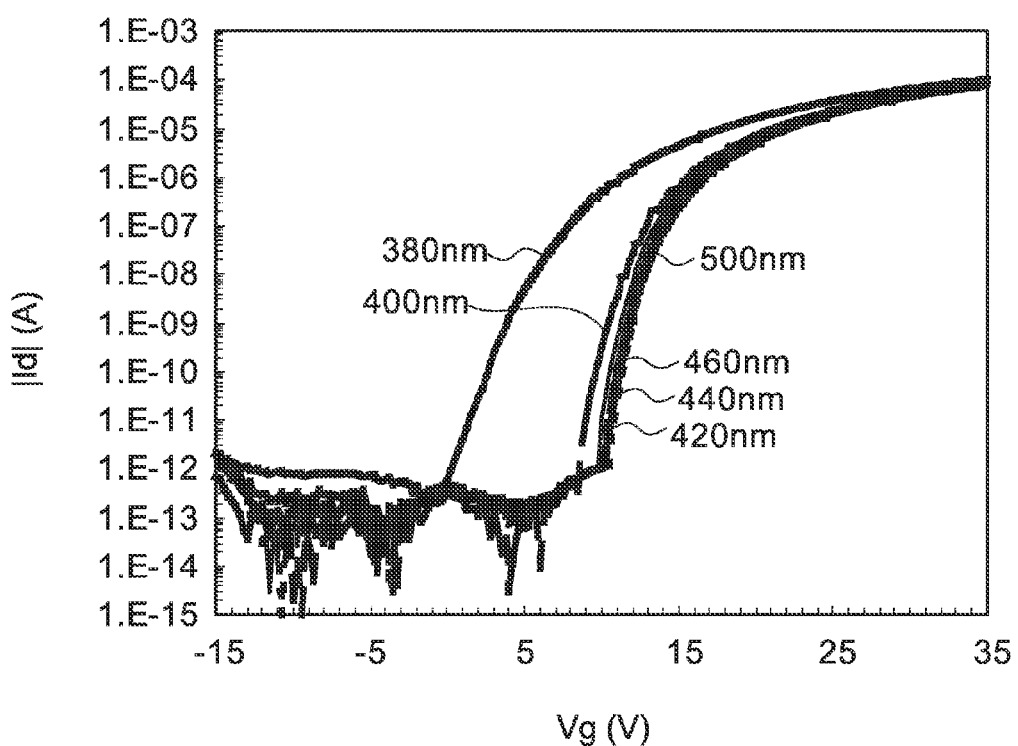
FIG. 18 is a diagram showing the results of measuring the Vg-Id characteristics when the active layer of the TFT 1 is irradiated with monochromatic light of different wavelengths.

In the TFT 1 pertaining to example 5 (b=1.3, c=1), no changes were seen in the off-state current even when the TFT 1 was irradiated with monochromatic light whose wavelength was equal to or greater than 420 nm (see FIG. 18 and Table 7). Further, in relation also to mobility and Vth at the time of light irradiation, these also did not change because of light whose wavelength was equal to or greater than 420 nm (see FIG. 14 and FIG. 16). Consequently, there was obtained the effect that the TFT 1 was not affected with respect to light whose wavelength was equal to or greater than 420 nm, so it can be said that the TFT 1 exhibited a sufficient photoresponsive property as a TFT for organic EL driving.

Figure 19:
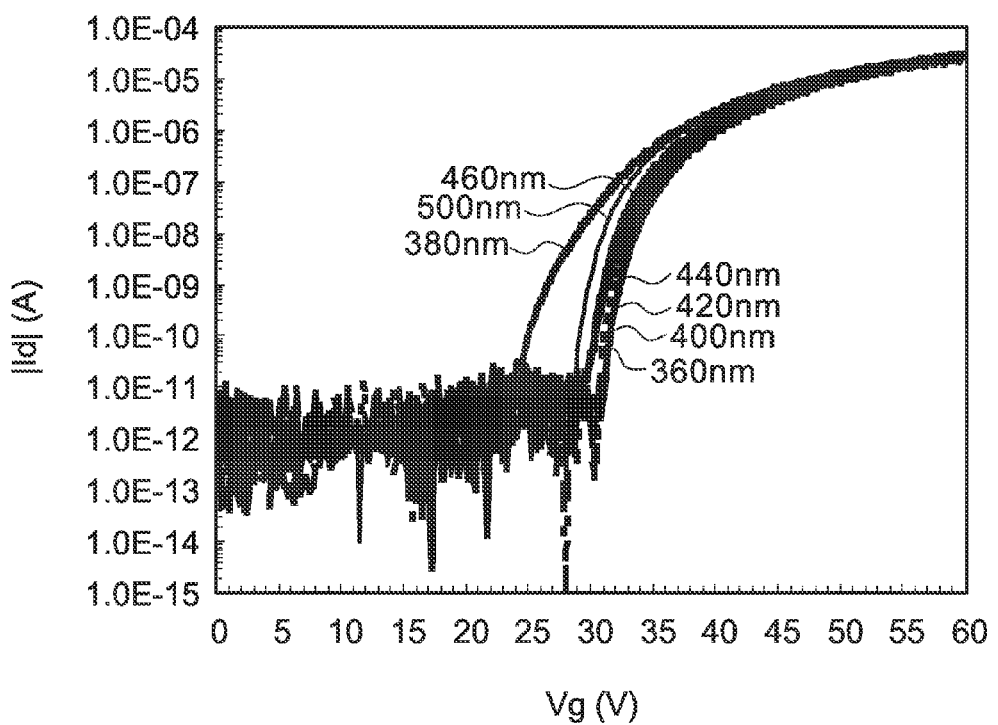
FIG. 19 is a diagram showing the results of measuring the Vg-Id characteristics when the active layer of the TFT 2 is irradiated with monochromatic light of different wavelengths.

Further, in the TFT 2 pertaining to example 6 (b=1.5, c=1), no changes were seen in the off-state current even when the TFT 2 was irradiated with monochromatic light with a short wavelength of 380 nm or 400 nm (see FIG. 19 and Table 7). In relation to mobility, the drop in mobility was 5% even when the TFT 2 was irradiated with monochromatic light whose wavelength was 380 nm, and no affects on mobility were seen in the visible light region. Consequently, it was shown that the TFT 1 exhibited a sufficient photoresponsive property as a TFT for organic EL driving.

Moreover, in the TFT 3 pertaining to example 7 (b=1.3, c=2), the increase in the off-state current was remarkable when the TFT 3 was irradiated with monochromatic light whose wavelength was equal to or less than 400 nm. In relation also to when the TFT 3 was irradiated with monochromatic light whose wavelength was 420 nm, the off-state current slightly increases, but no Id shift was seen in the on region, and virtually no changes were seen in mobility and threshold (see FIG. 21 and Table 7). Consequently, it was shown that the TFT 3 exhibited a sufficient photoresponsive property as a TFT for organic EL driving.

Moreover, in the TFT 4 (b=1.5, c=2) pertaining to example 8, when the TFT 4 was irradiated with monochromatic light whose wavelength was 380 nm, the TFT characteristics underwent a negative shift, and the off-state current increased. However, no changes were seen in the off-state current even when the TFT 4 was irradiated with monochromatic light of a short wavelength of 400 nm or 420 nm (see FIG. 22 and Table 7). A drop started to be seen in mobility when the TFT 4 was irradiated with monochromatic light whose wavelength was 420 nm (see FIG. 14), but virtually no changes were seen in Vth and the off-state current (see Tables 6 and 7), so the TFT 4 is considered to be usable for organic EL.

Further, in the amorphous oxide semiconductor material including In, Ga and Zn (In:Ga:Zn=a:b:c, a+b=2), there was seen a tendency for light absorption to shift toward the short wavelength side and for the band gap value to increase in accompaniment with an increase in the Ga composition ratio in both cases where c=1 and c=2 (see FIG. 5). As a result of measuring the TFT characteristics at the time of monochromatic light irradiation, by increasing the composition ratio b of Ga and expanding the band gap, there were obtained the results that the TFT light irradiation characteristics improve and the realization of a TFT with high photostability is possible. In particular, from the results shown in FIG. 14 to FIG. 22, the TFT 1 where the active layer has the composition ratio of b=1.3 and c=1 shows the most stable TFT characteristics with respect to the visible light short-wavelength region, so it was shown that the composition range around b=1.3 and c=1 is a preferred range.

—Evaluations after Heat Treatment—
(Thin Film Evaluation)

With respect to the IGZO films 5 and 6 and the comparative IGZO films 5 and 6 after heat treatment pertaining to examples 9 and 10 and comparative examples 9 and 10, X-ray diffraction measurement and evaluations of the composition ratio, the optical properties and the electrical properties were performed. The methods of the evaluations were the same as the aforementioned methods. Table 8 shows the results of the evaluations. In order to facilitate a comparison of the evaluations before and after the heat treatment, the evaluations of the IGZO films before the heat treatment already shown in Table 2 are also shown in Table 8.

TABLE 8

| Sample Name | In:Ga:Zn | b | c | Heat Treatment | Crystallinity | Sheet Resistance ($\Omega$/sq) | Resistivity ($\Omega \cdot cm$) | Electrical Conductivity (S/cm) | Optical Band Gap |
|---|---|---|---|---|---|---|---|---|---|
| Comparative IGZO Film 1 | 1.1:0.9:1.0 | 0.9 | 1.0 | Before | Amorphous | $1.14 \times 10^9$ | $1.22 \times 10^4$ | $8.17 \times 10^{-5}$ | 3.77 |
| Comparative IGZO Film 2 | 1.0:1.0:1.0 | 1.0 | | | Amorphous | $1.38 \times 10^9$ | $1.37 \times 10^4$ | $7.31 \times 10^{-5}$ | 3.81 |
| IGZO Film 1 | 0.7:1.3:1.0 | 1.3 | | | Amorphous | $1.16 \times 10^{12}$ | $1.17 \times 10^7$ | $8.52 \times 10^{-8}$ | 3.97 |
| IGZO Film 2 | 0.5:1.5:1.0 | 1.5 | | | Amorphous | $6.56 \times 10^{13}$ | $6.56 \times 10^8$ | $1.52 \times 10^{-9}$ | 4.05 |
| Comparative IGZO Film 5 | 1.1:0.9:1.0 | 0.9 | 1.0 | After (180° C.) | Amorphous | $9.21 \times 10^6$ | $9.90 \times 10^1$ | $1.01 \times 10^{-2}$ | 3.81 |
| Comparative IGZO Film 6 | 1.0:1.0:1.0 | 1.0 | | | Amorphous | $8.23 \times 10^7$ | $8.18 \times 10^2$ | $1.22 \times 10^{-3}$ | 3.90 |
| IGZO Film 5 | 0.7:1.3:1.0 | 1.3 | | | Amorphous | $1.48 \times 10^9$ | $1.49 \times 10^4$ | $6.69 \times 10^{-5}$ | 4.00 |
| IGZO Film 6 | 0.5:1.5:1.0 | 1.5 | | | Amorphous | $4.38 \times 10^{10}$ | $4.38 \times 10^5$ | $2.28 \times 10^{-6}$ | 4.06 |

As a result of X-ray diffraction measurement, as shown in Table 8, the structures of each of the IGZO films after the heat treatment exhibited a broad pattern where all were considered amorphous.

In relation also to the optical band gaps of each of the IGZO films after the heat treatment, the optical band gaps tended to increase albeit slightly, and it was confirmed that the optical band gaps did not drop as compared to the IGZO films 1 and 2 and the comparative IGZO films 1 and 2 before the heat treatment.

In relation to the electrical properties, the changes before and after the heat treatment were remarkable.

(TFT Characteristics)

Next, in relation to the TFT 5 and the comparative TFT 5 pertaining to example 11 and comparative example 11, the TFT characteristics (Vg-Id characteristics, Von, threshold voltage Vth, mobility μ, S value) were evaluated. The evaluation of the TFT characteristics was performed under a darkplace and dry-air environment after dry air was allowed to flow for 20 minutes or more. The Vg-Id characteristics were evaluated at a time when Vd=10 V. Further, Von is a voltage value (Vg) at a time when Id=$1\times10^{-11}$ A was obtained in relation to example 11 and is a Vg value at a time when Id=$1\times10^{-10}$ A was obtained in relation to comparative example 11.

Table 9 shows the results of evaluating the TFT characteristics of the TFT 5 and the comparative TFT 5. In order to facilitate a comparison of the evaluations before and after the heat treatment, the evaluations of the TFTs before the heat treatment already shown in Table 3 are also shown in Table 9.

Figure 23:
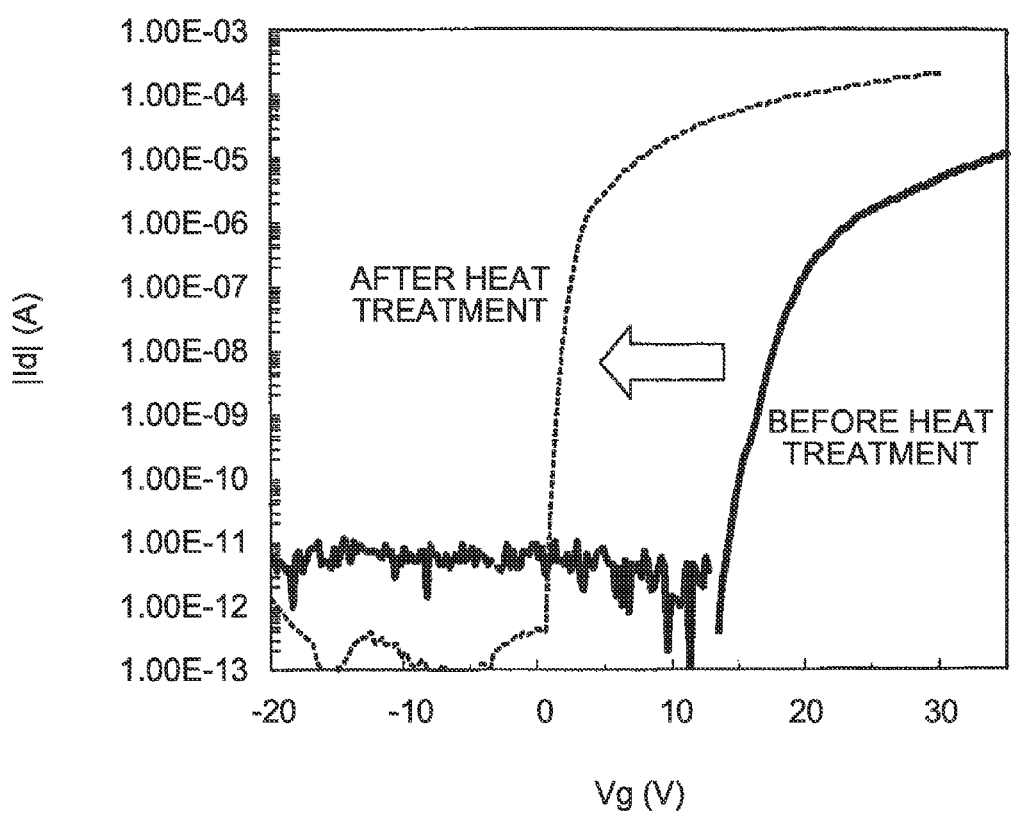
FIG. 23 is a diagram showing the results of measuring the Vg-Id characteristics before and after a heat treatment of TFTs (TFT 1 and TFT 5) having IGZO whose composition ratio is a=0.7, b=1.3 and c=1.0 as their active layers.

Further, FIG. 23 shows the results of measuring the Vg-Id characteristics before and after the heat treatment (TFT 1, TFT 5) of the TFTs having for their active layers an IGZO film where the composition ratio is a=0.7, b=1.3 and c=1.0. The active layers were not irradiated with light at this time.

From the results of Table 9 and FIG. 23, it was understood that the Vg-Id characteristics of the TFT 5 after the heat treatment underwent a large negative shift as compared to the TFT 1 before the heat treatment. Further, in the TFT 5, the off-state current exhibited substantially the same value and the on-state current increased as compared to the TFT 1. Moreover, it could also be confirmed that the on-state voltage Von and the S value improved because of the heat treatment.

What is claimed is:

1. An amorphous oxide semiconductor material comprising an amorphous oxide semiconductor including In, Ga and Zn, wherein when In:Ga:Zn=a:b:c denotes an element composition ratio of the oxide semiconductor, the element composition ratio is defined by the range of a+b=2 and $1.25 \leq b \leq 1.5$ and c <4b−3.2 and c>−5b+8 and $1 \leq c \leq 2$, and wherein an optical band gap of the amorphous oxide semiconductor material is equal to or greater than 3.85 eV.

2. A field-effect transistor having an active layer that comprises the amorphous oxide semiconductor material according to claim 1 and whose electrical conductivity σ is $10^{-9} \leq \sigma \leq 10^{-2}$ (S/cm).

3. The field-effect transistor according to claim 2, wherein the amorphous oxide semiconductor material is heat-treated.

4. A display device equipped with the field-effect transistor according to claim 2.

5. An amorphous oxide semiconductor material comprising an amorphous oxide semiconductor including In, Ga and

TABLE 9

| Sample Name | In:Ga:Zn | b | c | Heat Treatment | Von (V) | Vth (V) | Mobility μ (cm²/S·V) | S Value (V/decade) |
|---|---|---|---|---|---|---|---|---|
| Comparative TFT 1 | 1.1:0.9:1.0 | 0.9 | 1.0 | Before | 1.0 | 4.33 | 8.49 | 0.41 |
| Comparative TFT 5 | 1.1:0.9:1.0 | 0.9 | | After | −37 | −26.23 | 16.40 | 1.33 |
| TFT 1 | 0.7:1.3:1.0 | 1.3 | | Before | 14.5 | 18.71 | 2.73 | 0.49 |
| TFT 5 | 0.7:1.3:1.0 | 1.3 | | After | 0.8 | 2.48 | 6.95 | 0.26 |

Zn, wherein when In:Ga:Zn=a:b:c denotes an element composition ratio of the oxide semiconductor, the element composition ratio is defined by the range of a+b=2 and c<4b−3.2 and c<−5b+8 and 1≤c and 1.25≤b≤1.5, and an optical band gap of the amorphous oxide semiconductor material is equal to or greater than 3.85 eV.

6. A bottom-emission display device comprising:
a substrate;
the field-effect transistor according to claim 2 which is placed on the substrate and has a bottom-gate structure; and
an organic electroluminescent element that is electrically connected to the field-effect transistor on the substrate,
wherein light emitted from the organic electroluminescent element is produced from the substrate side.

7. A display device comprising:
a light-emitting layer configured to irradiate light at a wavelength of from 380 nm to 440 nm; and
an amorphous oxide semiconductor material comprising In, Ga and Zn, wherein when In:Ga:Zn=a:b:c denotes an element composition ratio of the oxide semiconductor, the element composition ratio is defined by the range of a+b=2 and 1.25≤b≤1.5 and c<4b−3.2 and c>−5b+8 and 1≤c≤2.

8. A display device comprising:
a light-emitting layer configured to irradiate blue light; and
an active layer including an amorphous oxide semiconductor material comprising In, Ga and Zn, wherein when In:Ga:Zn=a:b:c denotes an element composition ratio of the oxide semiconductor, the element composition ratio is defined by the range of a+b=2 and 1.25≤b≤1.5 and c<4b−3.2 and c>−5b+8 and 1≤c≤2.

* * * * *